United States Patent
Wu et al.

(10) Patent No.: US 9,806,212 B2
(45) Date of Patent: Oct. 31, 2017

(54) ULTRATHIN GROUP II-VI SEMICONDUCTOR LAYERS, GROUP II-VI SEMICONDUCTOR SUPERLATTICE STRUCTURES, PHOTOVOLTAIC DEVICES INCORPORATING THE SAME, AND RELATED METHODS

(71) Applicants: University of Kansas, Lawrence, KS (US); Bing Li, Chengdu (CN); Liang-huan Feng, Chengdu (CN)

(72) Inventors: Judy Z. Wu, Lawrence, KS (US); Bing Li, Chengdu (CN); Liang-huan Feng, Chengdu (CN)

(73) Assignee: University of Kansas, Lawrence, KS (US)

( * ) Notice: Subject to any disclaimer, the term of this patent is extended or adjusted under 35 U.S.C. 154(b) by 171 days.

(21) Appl. No.: 14/419,768

(22) PCT Filed: Aug. 9, 2013

(86) PCT No.: PCT/US2013/054315
§ 371 (c)(1),
(2) Date: Feb. 5, 2015

(87) PCT Pub. No.: WO2014/026099
PCT Pub. Date: Feb. 13, 2014

(65) Prior Publication Data
US 2015/0214403 A1 Jul. 30, 2015

Related U.S. Application Data

(60) Provisional application No. 61/681,708, filed on Aug. 10, 2012.

(51) Int. Cl.
*H01L 31/0352* (2006.01)
*H01L 31/0392* (2006.01)
(Continued)

(52) U.S. Cl.
CPC ...... *H01L 31/035236* (2013.01); *B82Y 20/00* (2013.01); *H01L 31/0296* (2013.01);
(Continued)

(58) Field of Classification Search
CPC ......... H01L 31/035236; H01L 31/0336; H01L 31/18; H01L 31/0296; H01L 31/1828
See application file for complete search history.

(56) References Cited

U.S. PATENT DOCUMENTS

| 5,045,897 A | * | 9/1991 | Ahlgren | B82Y 20/00 257/103 |
| 5,416,337 A | * | 5/1995 | Chang | H01L 33/06 257/103 |

(Continued)

FOREIGN PATENT DOCUMENTS

| CN | 01538742 A | * | 9/2009 | ............. C30B 23/00 |
| JP | 04-39971 | * | 2/1992 | ............. H01L 31/04 |

(Continued)

OTHER PUBLICATIONS

Acharya, "Spectral and emission characteristics of LED and its application to LED-based sun-photometry", Optics & Laser Technology 37 (2005) 547-550, Sep. 2004.*

(Continued)

*Primary Examiner* — Devina Pillay
(74) *Attorney, Agent, or Firm* — Bell & Manning, LLC

(57) ABSTRACT

Disclosed are ultrathin layers of group II-VI semiconductors, group II-VI semiconductor superlattice structures, photovoltaic devices incorporating the layers and superlattice structures and related methods. The superlattice structures comprise an ultrathin layer of a first group II-VI semiconductor alternating with an ultrathin layer of at least one
(Continued)

additional semiconductor, e.g., a second group II-VI semiconductor, or a group IV semiconductor, or a group III-V semiconductor.

19 Claims, 7 Drawing Sheets

(51) Int. Cl.
  *H01L 31/073*  (2012.01)
  *B82Y 20/00*  (2011.01)
  *H01L 31/0296*  (2006.01)
  *H01L 31/0336*  (2006.01)
  *H01L 31/18*  (2006.01)

(52) U.S. Cl.
  CPC .... *H01L 31/0336* (2013.01); *H01L 31/03925* (2013.01); *H01L 31/073* (2013.01); *H01L 31/18* (2013.01); *H01L 31/1828* (2013.01); *Y02E 10/543* (2013.01)

(56) References Cited

U.S. PATENT DOCUMENTS

| | | | | |
|---|---|---|---|---|
| 5,783,838 | A * | 7/1998 | Kyozuka | B82Y 20/00 257/16 |
| 7,824,955 | B2 | 11/2010 | White et al. | |
| 2006/0160335 | A1 * | 7/2006 | Li | C03C 17/34 438/482 |
| 2009/0235986 | A1 | 9/2009 | Hotz et al. | |
| 2011/0005570 | A1 * | 1/2011 | Jain | B82Y 20/00 136/244 |
| 2012/0160312 | A1 * | 6/2012 | Arakawa | B82Y 20/00 136/255 |

FOREIGN PATENT DOCUMENTS

| | | |
|---|---|---|
| JP | 2005537644 | 12/2005 |
| KR | 1020100085769 | 7/2010 |
| KR | 1020110003802 | 1/2011 |
| WO | WO2009043725 | 4/2009 |

OTHER PUBLICATIONS

Al-Zarouni, "The electronic properties of the strained CdTe/ZnTe(001) superlattices", J. Phys.: Condens. Matter 14 (2002) 7835-7851, Aug. 2002.*

Taguchi, "Band Offsets in CdZnS/ZnS Strained-Layer Quantum Well and Its Application to UV Laser Diode", Jpn. J. Appl. Phys. vol. 32(1993) pp. L1308-L1311, Part 2, No. 9B, Sep. 1993.*

Laref, "Electronic structure and optical properties of (ZnSe)n/(Si2)m (111) superlattices", Journal of Applied Physics 99, 043702 _2006, pp. 043702-1-043702-7, Feb. 2006.*

Obaidat,"Charge confinements in CdSe—ZnSe symmetric double quantum wells", J. Phys.: Condens. Matter 20 (2008) 165205 (10pp), Mar. 2008, pp. 1-10*

JP04-39971, Machine Translation, Imamura, Feb. 1992.*

CN01538742 A, Machine Translation, Meng, Sep. 2009.*

AC Varonides, High Efficiency Lattice-Matched Multijunction Solar Cells Via Tuned GaAs/Ge Quantum Wells, 25th European Photovoltaic Solar Energy Conference and Exhibition/5th World Conference on Photovoltaic Energy Conversion, Valencia, Spain, Sep. 6-10, 2010, pp. 329-332.

AC Varonides (2011). High Efficiency Solar Cells via Tuned Superlattice Structures: Beyond 42.2%, Solar Cells—New Aspects and Solutions, Prof. Leonid A. Kosyachenko (Ed.), ISBN: 978-953-307-761-1, InTech.

Pandey et al., Growth of cubic and hexagonal CdTe thin films by pulsed laser deposition, Thin Solid Films, vol. 473, Aug. 13, 2004, pp. 54-57.

Dubowski et al., Epitaxial growth of (100)CdTe on (100)GaAs induced by pulsed laser evaporation, Appl. Phys. Lett., vol. 46, Jun. 1, 1985, pp. 1081-1083.

Ren et al., Fabrication of CdS—ZnS layered thin films by hydrothermal seeded growth method, Thin Solid Films, vol. 513, Feb. 13, 2006, pp. 99-102.

Li et al., CdSe/CdTe type-II superlattices grown on GaSb (001) substrates by molecular beam epitaxy, Appl. Phys. Lett., vol. 100, No. 121908, Mar. 22, 2012, pp. 1-3.

Li et al., Photoluminescence studies of type-II CdSe/CdTe superlattices, Appl. Phys. Lett., vol. 101, No. 061915, Aug. 9, 2012, pp. 1-4.

Ramiro et al., Pulsed laser deposition and electrodeposition techniques in growing CdTe and $Cd_xHg_{1-x}Te$ thin films, Thin Solid Films, vol. 361-362, 2000, pp. 65-69.

X. Wu, High-efficiency polycrystalline CdTe thin-film solar cells, Solar Energy, vol. 77, Aug. 4, 2004, pp. 803-814.

Marsillac et al., Ultra-thin bifacial CdTe solar cell, Solar Energy Materials & Solar Cells, vol. 91, Jun. 1, 2007, pp. 1398-1402.

N.G. Anderson, Proposal for a new superlattice-based solar cell structure, Solar Energy, vol. 50, No. 2, 1993, pp. 191-192.

International Search Report and Written Opinion issued in PCT/US2013/054315, dated Dec. 9, 2013.

* cited by examiner

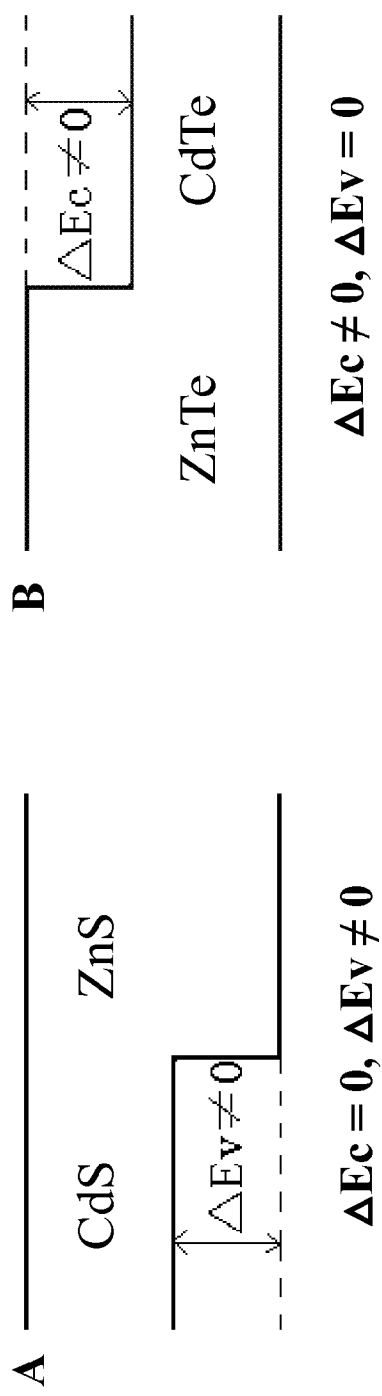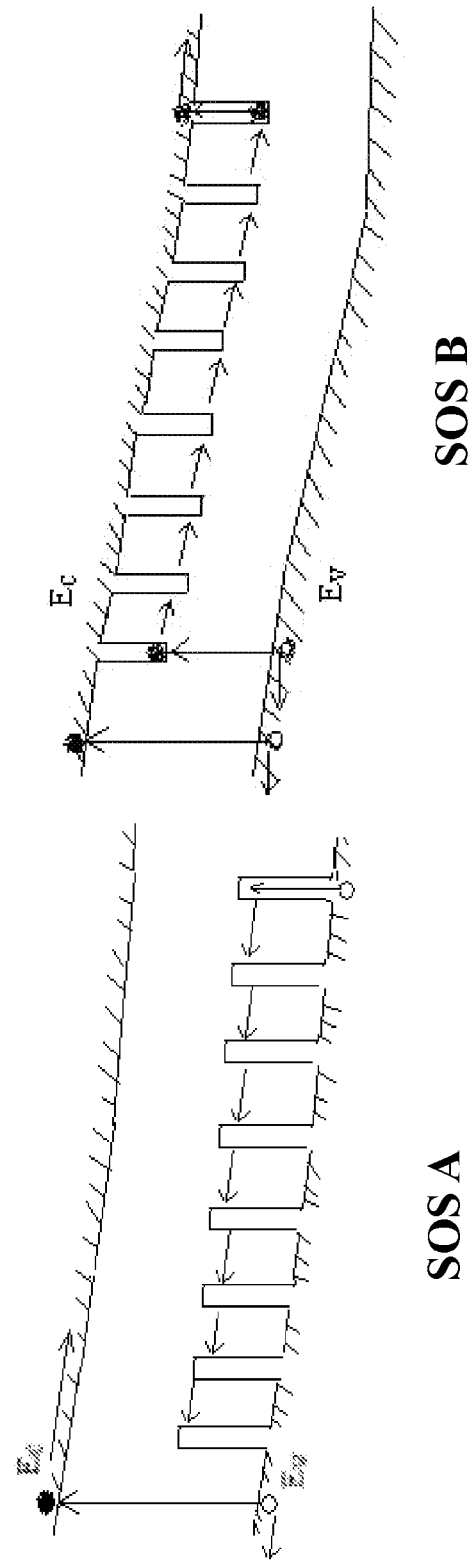
FIG. 2

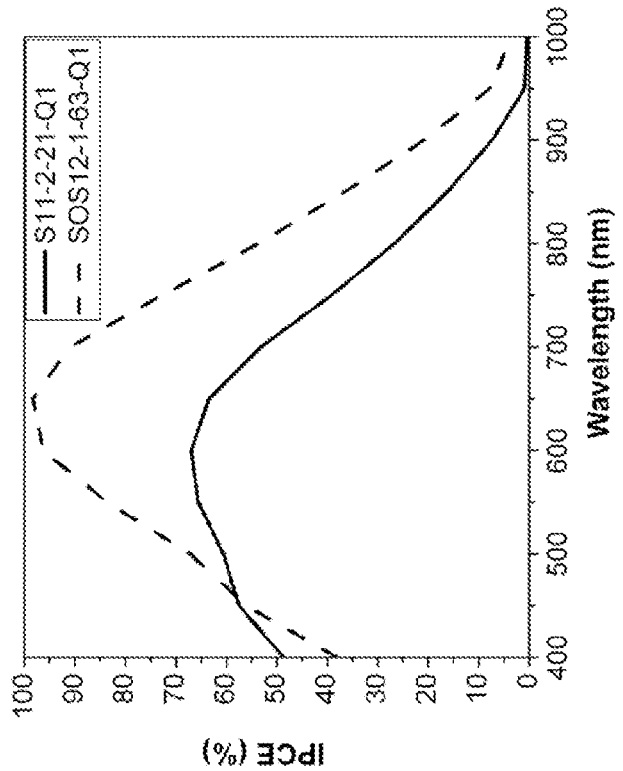
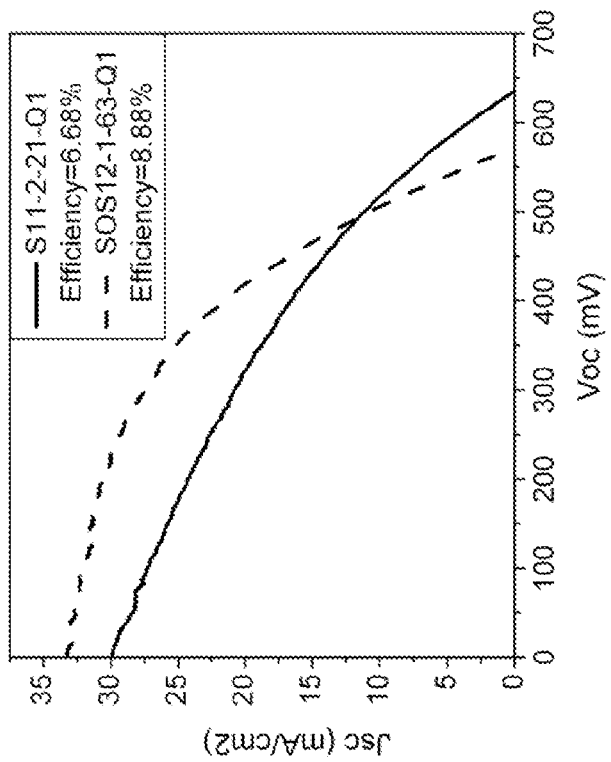
FIG. 6

ULTRATHIN GROUP II-VI SEMICONDUCTOR LAYERS, GROUP II-VI SEMICONDUCTOR SUPERLATTICE STRUCTURES, PHOTOVOLTAIC DEVICES INCORPORATING THE SAME, AND RELATED METHODS

CROSS-REFERENCE TO RELATED APPLICATIONS

This application is a National Stage of International Application No. PCT/US2013/054315, filed Aug. 9, 2013, which claims the benefit of U.S. provisional patent application Ser. No. 61/681,708, filed Aug. 10, 2012, the contents of which are incorporated herein by reference.

REFERENCE TO GOVERNMENT RIGHTS

This invention was made with government support under grant numbers DMR0803149, DMR1105986, and EPS-0903806 awarded by the National Science Foundation and under W911NF-09-1-0295 awarded by ARO. The government has certain rights in the invention.

BACKGROUND

CdTe has been recognized as an attractive photovoltaic (PV) material because of its direct band gap $E_g$ around 1.5 eV, which is near the optimal value for single p-n PV devices based on the Shockley-Queisser model. Because of its high absorption coefficient in excess of $10^4$ cm$^{-1}$ and its direct band-gap, a CdTe film about 1 µm thick is enough for absorption of ~90% of photons with energy higher than the band gap of CdTe. However, the most efficient solar cells reported use much thicker CdTe layers (e.g., 5-10 µm). Unfortunately, at a large CdTe thickness, the availability of Te may be a concern for production levels above 20 GW. Thin film CdS/CdTe PVs have been fabricated using magnetron sputtering. (S. Marsillac, V. Y. Parikh and A. D. Compann, "Ultra-thin bifacial CdTe solar cell," Sol. Energy Mater. Sol. Cells 91 (15-16), 1398-1402 (2007).) The use of energetic electrons, atoms, and/or ions in magnetron sputtering subsidizes the required kinetic energy for the adatom mobility at the growth interface, which is typically provided thermally with high substrate temperatures in other popular methods applied for CdTe thick-film PVs, such as closed-space sublimation (CSS) and thermal vapor transport. This results in significantly reduced processing temperatures. However, other methods for making efficient, high quality, cost-effective thin-film CdTe-based PVs at low temperatures are needed.

First generation photovoltaics (PVs) employ single p-n junctions of photoactive semiconductors with band gaps preferably around 1.5 eV to approach an upper limit of power conversion efficiency of 31% (the so-called Shockley-Queisser limit predicted theoretically for these 1$^{st}$ generation PVs). Although high efficiencies close to this limit have been demonstrated experimentally on lab scale PVs of other types of semiconductors, the best efficiency reported on CdTe-based PVs is about 17%. Achieving high efficiencies on commercial PV modules remains a challenge. Similarly, reducing the cost of solar energy remains a challenge.

To enhance the PV efficiency beyond the classical Shockley-Queisser limit, various 3$^{rd}$ generation PV ideas have been proposed—aimed primarily at improving light absorption, in particular the infrared light in the solar spectrum. One idea of tandem PVs using multiple band gaps has been successful in conversion of solar energy of broader spectrum and hence providing higher performance. Nevertheless, the associated high fabrication cost in molecular beam epitaxy (MBE) typically used for fabrication of the tandem PVs has limited their applications primarily to concentrated solar systems, in which the required bulky optics and active tracking add additional cost, hampering their large-scale commercialization. Another idea is to introduce an intermediate band (IB) inside the semiconductor band gap to explore possibility of exceeding the Shockley-Queisser limit (Luque, A., Marti, A., "Increasing the efficiency of ideal solar cells by photon induced transitions at intermediate levels." Phys. Rev. Lett. 1997, 78 (26), 5014-5017). Experimentally, IB is typically generated via impurity doping in the original photoactive semiconductors and the lack of control in the microstructure of the doped semiconductors typically leads to charge-trapping defects, resulting in charge recombination and low efficiency in IB-related PVs. The idea of using multiple quantum well (MQW) or superlattice structures adopts a narrower band gap semiconductor to form a superlattice with the original photoactive semiconductors, typically resulting in both a conduction band offset and a valence band offset. (Wu, X., Keane, J. C., Dhere, R. G., In Proceedings of the 17$^{th}$ European Photovoltaic Solar Energy Conference, p. 995, 2001.) The inclusion of the narrow band gap material is meant to provide light absorption in the longer wavelength spectrum, which is prohibited in the original single p-n junction PVs. However, high power conversion efficiencies beyond the classical Shockley-Queisser limit has not been obtained on these MQW and superlattice PVs. Moreover, the focus for 3$^{rd}$ generation MQW and superlattice PVs has been on group III-V semiconductors, such as the AlAs/GaAs system, which typically require MBE. Besides high fabrication costs, scaling up for roll-to-roll fabrication of PVs remains challenging using MBE.

SUMMARY

Provided are ultrathin layers of group II-VI semiconductors, group II-VI semiconductor superlattice structures, photovoltaic devices incorporating the ultrathin layers and superlattice structures, and related methods.

In one aspect, a photovoltaic device comprises a substrate, a back contact layer disposed over the substrate, a first group II-VI superlattice structure between the substrate and the back contact layer, the first group II-VI superlattice structure comprising alternating ultrathin layers of a first group II-VI semiconductor and at least one additional semiconductor, and a layer of semiconductor between the substrate and the back contact layer, the layer of semiconductor comprising a different majority charge carrier than the first group II-VI superlattice structure, wherein the first group II-VI superlattice structure is characterized by a substantially zero conduction band offset or a substantially zero valence band offset.

In another aspect, a group II-VI superlattice structure comprises alternating ultrathin layers of a first group II-VI semiconductor and a second group II-VI semiconductor, wherein the superlattice structure is characterized by a substantially zero conduction band offset or a substantially zero valence band offset.

In another aspect, a method of forming a group II-VI superlattice structure comprises, exposing a first target material comprising a source of a first group II-VI semiconductor to a pulsed laser, whereby an ultrathin layer of the first group II-VI semiconductor is deposited on a substrate via pulsed laser deposition, and exposing a second target material comprising a source of an additional semiconductor to a pulsed laser, whereby an ultrathin layer of the additional semiconductor is deposited over the substrate via pulsed laser deposition, in situ, and repeating steps (a) and (b), in situ, to provide the group II-VI superlattice structure.

Other principal features and advantages of the invention will become apparent to those skilled in the art upon review of the following drawings, the detailed description, the examples and the appended claims.

BRIEF DESCRIPTION OF THE DRAWINGS

Illustrative embodiments of the invention will hereafter be described with reference to the accompanying drawings, wherein like numerals denote like elements.

FIG. 2 shows schematics of single offset superlattice ("SOS") band structures for (A) zero conduction band offset and (B) zero valance band offset.

FIG. 6 shows current-voltage characteristics of a reference thin film solar cell and a SOS solar cell (A) and photocurrent action spectra of the solar cells (B).

DETAILED DESCRIPTION

Figure 1:
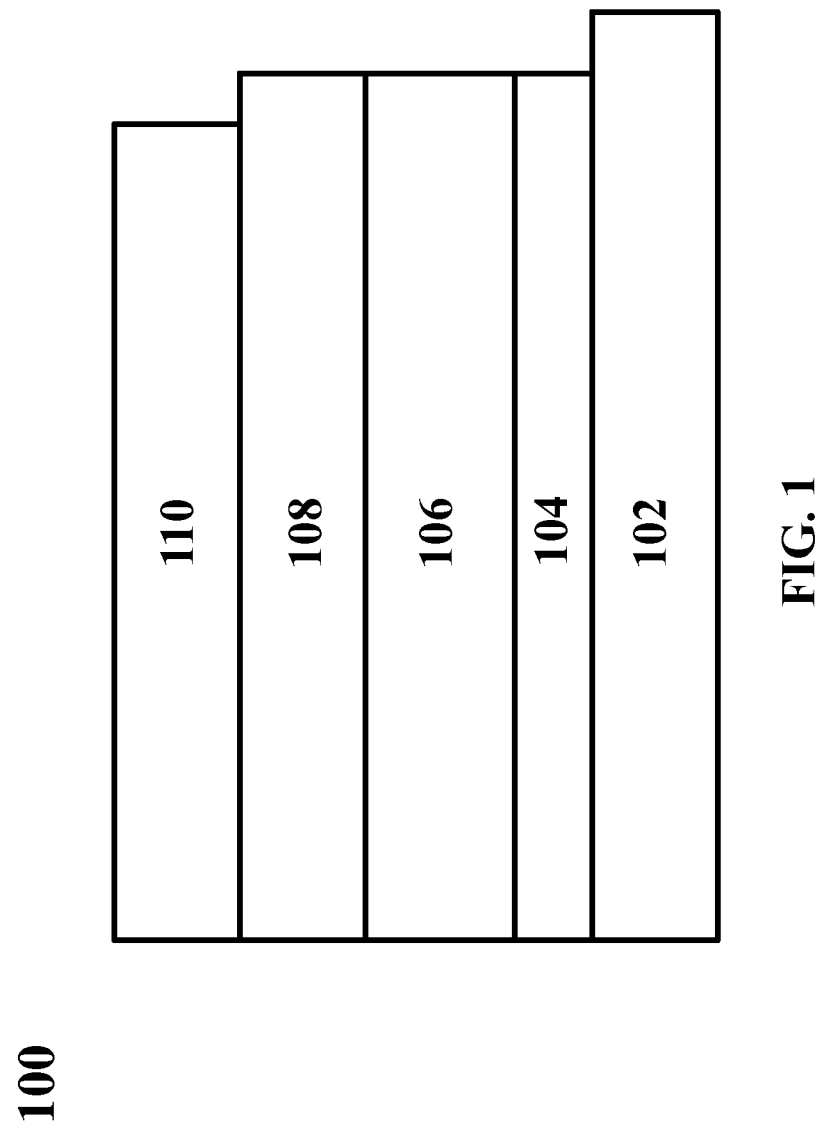
FIG. 1 shows a schematic structure of thin film CdS/CdTe solar cell made in situ using PLD.

Provided are ultrathin layers of group II-VI semiconductors, group II-VI semiconductor superlattice structures, photovoltaic devices incorporating the ultrathin layers and superlattice structures, and related methods.

Ultrathin Layers of Group II-VI Semiconductors

In one aspect, ultrathin layers of group II-VI semiconductors are provided. The term "ultrathin" can be defined as that thickness or thickness range which provides absorption of a certain percentage of photons having energy higher than the band gap of the layer. In some embodiments, the thickness of the ultrathin layer is about 2 µm or less. This includes embodiments in which the thickness of the ultrathin layer is about 1.8 µm or less, about 1.7 µm or less, about 1.6 µm or less, about 1.5 µm or less, about 1.2 µm or less, about 1 µm or less, about 800 nm or less, about 600 nm or less, about 400 nm or less, about 200 nm or less, about 100 nm or less, about 75 nm or less, about 50 nm or less, about 25 nm or less, about 10 nm or less, or about 5 nm or less. This further includes embodiments in which the thickness of the ultrathin layer is in the range of from about 100 nm to about 500 nm, from about 50 nm to about 250 nm, from about 0.2 nm to about 10 nm, or from about 0.5 nm to about 10 nm. The thickness may be an average thickness of the ultrathin layer, by which it is meant the average value of the thicknesses measured at multiple locations across the ultrathin layer.

The group II-VI semiconductor may be a binary semiconductor. However, more complex, e.g., ternary, group II-VI semiconductors may be used. In some embodiments, the group II-VI semiconductor is selected from CdTe, CdS, CdSe, CdO, ZnTe, ZnS, ZnSe, ZnO, $Cd_xZn_{1-x}Te$, $ZnS_xO_{1-x}$, etc.

The ultrathin layers may be characterized by a variety of properties such as band gap, transmittance, morphology (e.g., substantially free of pinholes), crystal structure (e.g., polycrystalline, single crystalline of cubic phase, hexagonal phase, etc.), and/or grain size (e.g., at least about 1 nm, at least about 10 nm, at least about 20 nm, at least about 30 nm, at least about 40 nm, at least about 50 nm or at least about 60 nm). In some embodiments, the ultrathin layer is polycrystalline. Layers of group II-VI semiconductors formed using epitaxial methods, e.g., molecular beam epitaxy (MBE), are typically single crystalline or monocrystalline. However, the methods disclosed herein are capable of achieving single crystalline/monocrystalline ultrathin layers.

Exemplary specific ultrathin layers of group II-VI semiconductors are described in the Examples below.

Group II-VI Semiconductor Superlattice Structures

In another aspect, group II-VI semiconductor superlattice structures are provided. The superlattice structures comprise alternating ultrathin layers of a group II-VI semiconductor and at least one additional semiconductor. A variety of additional semiconductors may be used. By way of example only, the additional semiconductor may be a group II-VI semiconductor, a group IV semiconductor, or a group III-V semiconductor. The superlattice structures may comprise one additional semiconductor to provide a $(AB)_n$ type superlattice structure, wherein n is an integer greater than 1 and typically from 2 to 200. However, the superlattice structures may comprise more than one additional semiconductor (e.g., two) to provide a $(ABC)_n$ type superlattice structure, wherein n is an integer greater than 1 and typically from 2 to 200. Superlattice structures comprising more than three different types of semiconductors may also be used.

In some embodiments, a superlattice structure comprises alternating ultrathin layers of a first group II-VI semiconductor and a second group II-VI semiconductor. In some embodiments, a superlattice structure comprises alternating ultrathin layers of a group II-VI semiconductor and a group IV semiconductor. In some embodiments, a superlattice structure comprises alternating ultrathin layers of a group II-VI semiconductor and a group III-V semiconductor. In some embodiments, a superlattice structure comprises alternating ultrathin layers of a first group II-VI semiconductor, a second group II-VI semiconductor, and a third group II-VI semiconductor.

In some embodiments, a superlattice structure consists essentially of or consists of alternating ultrathin layers of the group II-VI semiconductor and the additional semiconductor(s). By way of example only, in some embodiments, a superlattice structure consists essentially of or consists of alternating ultrathin layers of a first group II-VI semiconductor and a second group II-VI semiconductor.

The superlattice structure may be characterized by the magnitude of its conduction band offset and its valence band offset. In some embodiments, the superlattice structure is characterized by a zero or a substantially zero conduction band offset. This includes embodiments in which the conduction band offset is about 0.2 eV or less, about 0.15 eV or less, about 0.1 eV or less, about 0.05 eV or less, or about 0 eV. In some embodiments, the superlattice structure is characterized by a zero or a substantially zero valence band offset. This includes embodiments in which the valence band offset is about 0.2 eV or less, about 0.15 eV or less, about 0.1 eV or less, about 0.05 eV or less, or about 0 eV. The small band offset in either conduction or valance band of the component semiconductors results in single offset superlattice structures, which allow tuning of physical properties of only holes or electrons respectively for n-type (electron as dominant charges) and p-type (holes as dominant charges) semiconductors. Thus, both a superlattice structure characterized by a zero or substantially zero conduction band offset as well as a superlattice structure characterized by a zero or substantially zero valence band offset may be referred to as a "single offset superlattice" or a "SOS" structure.

The superlattice structure may be characterized by the band gaps of its primary semiconductor and its secondary semiconductor(s). By "primary semiconductor," it is meant the semiconductor having the band gap closest to the ideal band gap for the particular application. For example, for a solar cell application, the ideal band gap is about 1.5 eV and the semiconductor in the superlattice structure having the band gap closest to 1.5 eV would be the primary semiconductor. The one or more additional semiconductors in the superlattice structure would be the secondary semiconductor(s). In some embodiments, the superlattice structure is characterized such that the primary semiconductor of the superlattice structure has a band gap that is less than the band gap(s) of the secondary semiconductor(s) of the superlattice structure. Such a selection is contrary to the design of conventional superlattice structures for solar cell applications, e.g., group III-V semiconductor superlattice and multiple quantum well (MQW) structures. For example, for the AlAs/GaAs p-n junction, a MQW structure of GaAs—Ge was used to replace the layer of GaAs. The primary semiconductor, GaAs, has a band gap of about 1.43 and the secondary semiconductor, Ge, has a band gap of about 0.67. The purpose of incorporating a secondary semiconductor having a band gap that is less than the band gap of the primary semiconductor was to improve efficiency by improving light absorption in the longer wavelength spectrum. However, as a result, such MQW structures also have impurity levels generated inside the band gap of the primary semiconductor, resulting in the formation of deep traps of charges due to imperfection of the MQW structure such as growth defects in component layers, strained or chemically contaminated interfaces between component layers. The inventors have found that this problem can be avoided by using superlattice structures in which the secondary semiconductor has a band gap that is greater than the band gap of the primary semiconductor.

In some embodiments, the superlattice structure is characterized such that one of the group II-VI semiconductor ultrathin layer and the at least one additional semiconductor ultrathin layer has a band gap of about 0.7 eV or greater and the other has a greater band gap. In some embodiments, the superlattice structure is characterized such that one of the group II-VI semiconductor ultrathin layer and the at least one additional semiconductor ultrathin layer has a band gap of about 1.4 eV or greater and the other has a greater band gap. In some embodiments, the superlattice structure is characterized such that one of the group II-VI semiconductor ultrathin layer and the at least one additional semiconductor ultrathin layer has a band gap of in the range of from about 1.4 eV to about 1.5 eV and the other has a greater band gap. In some embodiments, the superlattice structure is characterized such that each of the group II-VI semiconductor ultrathin layer and the at least one additional semiconductor ultrathin layer has a band gap of about 1.4 eV or greater. In some embodiments, the superlattice structure is characterized such that at least one of the group II-VI semiconductor ultrathin layer and the at least one additional semiconductor ultrathin layer has a band gap of about 1.8 eV or greater. In some embodiments, the superlattice structure comprises alternating ultrathin layers of CdTe and at least one additional semiconductor, wherein the at least one additional semiconductor has a band gap that is greater than the band gap of the CdTe ultrathin layer. In some embodiments, the superlattice structure comprises alternating ultrathin layers of CdS and at least one additional semiconductor, wherein the at least one additional semiconductor has a band gap that is greater than the band gap of the CdS ultrathin layer. As shown in the Examples below, such an embodiment may provide for improved light transmittance and better microstructure (i.e., lower pin hole density). In some embodiments, the superlattice structure comprises alternating ultrathin layers of a group II-VI semiconductor and a group IV semiconductor, wherein the band gap of the group II-VI semiconductor is greater than the band gap of the group IV semiconductor. In some embodiments, these band gaps refer to the undoped ultrathin layers.

In some embodiments, the superlattice structure is a p-type superlattice structure. In some embodiments, the superlattice structure is an n-type superlattice structure.

The thickness of the individual ultrathin layers making up the superlattice structures may assume a range of values. The thickness may be that which maximizes the quantum confinement of charge carriers, and thus, carrier lifetime, within the superlattice structure. In some embodiments, the thickness of the ultrathin layers of the superlattice structure is about 10 nm or less. This includes embodiments in which the thickness is about 8 nm or less, about 6 nm or less, about 5 nm or less, or about 3 nm or less. This further includes embodiments in which the thickness is in the range of from about 0.2 nm to about 10 nm, from about 1 nm to about 10 nm, from about 0.2 nm to about 5 nm, or from about 0.2 nm to about 1 nm.

In some embodiments, the thickness of the ultrathin layers may be greater than about 10 nm but less than about 100 nm, in which case the structure may be referred to as a multi-quantum well (MQW) structure. In some embodiments, the thickness of the ultrathin layers of the superlattice structure is in the range of from about 10 nm to about 100 nm. This includes embodiments in which the thickness is in the range of from about 10 nm to about 50 nm, or from about 10 nm to about 25 nm.

The thicknesses of the different types of semiconductor ultrathin layers within the superlattice structures (i.e., the group II-VI semiconductor ultrathin layer and the at least one other additional semiconductor ultrathin layer) may be the same or different. In some embodiments, the thickness of the primary semiconductor ultrathin layer (e.g., CdTe) is greater than the thickness of the secondary semiconductor ultrathin layer(s) (e.g., ZnTe). In some embodiments, the thickness of the primary semiconductor ultrathin layer is in the range of from about 1 nm to about 10 nm and the thickness of the secondary semiconductor ultrathin layer(s) is in the range of from about 0.1 nm to about 1 nm.

As discussed above with respect to the ultrathin layers of group II-VI semiconductors, the thickness of the ultrathin layers of the superlattice structure may be an average thickness of the ultrathin layer, by which it is meant the average value of the thicknesses measured at multiple locations across the ultrathin layer.

The thickness of the superlattice structure itself may also assume a range of values. However, in some embodiments, the thickness of the superlattice structure is about 2 µm or less. This includes embodiments in which the thickness of the superlattice structure is about 1.8 µm or less, about 1.7 µm or less, about 1.6 µm or less, about 1.5 µm or less, about 1.2 µm or less, about 1 µm or less, about 800 nm or less, about 600 nm or less, about 400 nm or less, about 200 nm or less, about 100 nm or less, or about 50 nm or less. As discussed above with respect to the ultrathin layers of the superlattice structure, the thickness of the superlattice structure may be an average thickness, by which it is meant the average value of the thicknesses measured at multiple locations across the superlattice structure.

The periodicity, e.g., the number of repeating layers (e.g., bilayers, trilayers, etc.) in the superlattice structures may vary. In some embodiments, the number of repeating layers in the superlattice is in the range from 2 to 200. This includes embodiments in which the number of repeating layers in the superlattice is in the range from 2 to 100, from 2 to 50, or from 2 to 25. This includes embodiments in which the total number of layers in the superlattice structure is in the range of from 4 to 400, 4 to 200, 4 to 100 or 4 to 50.

As noted above, the superlattice structures comprise ultrathin layers of group II-VI semiconductors and ultrathin layers of an additional semiconductor(s) (e.g., another group II-VI semiconductor, a group IV semiconductor, a group III-V semiconductor). Exemplary suitable group II-VI semiconductors have been described above. The additional semiconductor(s) may be single element semiconductors, binary semiconductors or more complex alloys. Exemplary group IV semiconductors include Ge, Si, etc. Exemplary suitable group III-V semiconductors include GaAs, AlAs, GaSb, AlSb, GaP, AlP, $Ga_xAl_{1-x}As$, etc. Other suitable semiconductors include PbS, $Cu_2O$, CuCl, $TiO_2$, etc. In some embodiments, the superlattice structures comprise ultrathin layers of semiconductors selected from CdTe, CdS, CdSe, ZnTe, ZnS, ZnSe, or Si. In some embodiments, the superlattice structure comprises alternating ultrathin layers of CdTe and ZnTe. In some embodiments, the superlattice structure comprises alternating ultrathin layers of CdS and ZnS. In some embodiments, the superlattice structure comprises alternating ultrathin layers of CdSe and ZnSe. In some embodiments, the superlattice structure comprises alternating ultrathin layers of ZnSe and Si. In some embodiments, the superlattice structure comprises alternating ultrathin layers of CdTe and $Cd_xZn_{1-x}Te$.

In some embodiments, the superlattice structure does not comprise HgTe. In some embodiments, the superlattice structure does not comprise alternating ultrathin layers of HgTe and CdTe. In some embodiments, the superlattice structure does not comprise alternating ultrathin layers of CdSe and CdTe. In some embodiments, the superlattice structure does not comprise alternating ultrathin layers of ZnSe and ZnTe.

The superlattice structure may be characterized by the degree of lattice mismatch between the different types of semiconductors making up the ultrathin layers of the superlattice structure. In some embodiments, the lattice constant of the group II-VI semiconductor ultrathin layer and the lattice constant of the at least one additional semiconductor differ by at least about 5%. This includes embodiments in which the lattice constant of the group II-VI semiconductor ultrathin layer and the lattice constant of the at least one additional semiconductor differ by at least about 6%, at least about 7%, at least about 8%, at least about 9%, or at least about 10%. However, smaller degrees of lattice mismatch may also be used. Smaller degrees of lattice mismatch (e.g., less than about 3%) may be used to provide epitaxial superlattice structures in order to minimize the possibility of a strained interface between the component layers. By contrast, the degree of lattice mismatch is typically not a concern for polycrystalline superlattice structures.

The superlattice structures (and/or the ultrathin layers making up the superlattice structures) may be characterized by a number of different properties such as transmittance, charge carrier density and mobility (both electrons and holes), morphology, crystal structure and grain size as discussed above with respect to the ultrathin layers of group II-VI semiconductors. Other properties include grain boundaries and the interface between adjacent ultrathin layers.

Regarding the optical characteristics of the superlattice structures, in some embodiments, the superlattice structure is configured to maximize the absorption (minimize transmission) of incident sunlight or incident light having wavelengths within a particular range. Such superlattice structures may be referred to as absorber superlattice structures. In some embodiments, the superlattice structure is characterized by an average absorption of at least about 60%. This includes embodiments in which the superlattice structure is characterized by an average absorption of at least about 65%, at least about 70%, at least about 75%, or at least about 80%, or even greater. An increase in absorption translates to improved efficiency of certain photovoltaic devices incorporating such superlattice structures. These percentages may refer to the average absorption as measured over a particular spectral range, e.g., about 400 nm to about 1000 nm or about 600 nm to about 1000 nm. These percentages may refer to a superlattice structure characterized by a particular average thickness, e.g., any of the average thicknesses described above.

In some embodiments, the superlattice structure is configured to maximize the transmission (minimize absorption) of incident sunlight or incident light having wavelengths within a particular range. Such superlattice structures may be referred to as window superlattice structures. In some embodiments, the superlattice structure is characterized by an average transmission of at least about 70%. This includes embodiments in which the superlattice structure is characterized by an average transmission of at least about 75%, at least about 80%, at least about 85%, or at least about 90%, or even greater. An increase in transmission translates to improved efficiency of certain photovoltaic devices incorporating such superlattice structures. These percentages may refer to the average transmission as measured over a particular spectral range, e.g., about 400 nm to about 1000 nm or about 400 nm to about 800 nm, or about 500 nm to about 800 nm. These percentages may refer to a superlattice structure characterized by a particular average thickness, e.g., any of the average thicknesses described above.

Regarding the crystal structure of the superlattice structures, in some embodiments, the ultrathin layers making up the superlattice structures are polycrystalline. As discussed above with respect to ultrathin layers of group II-VI semiconductors, superlattice structures having epitaxial forms, such as those formed using molecular beam epitaxy (MBE), are typically single crystalline or monocrystalline. However, the methods disclosed herein are capable of achieving single crystalline/monocrystalline superlattice structures with sub-nm precision in controlling the component layer thicknesses.

The superlattice structures may be characterized by the diffusion lifetime in lateral and vertical directions, the latter of which is critical to the performance of photovoltaic devices incorporating the superlattice structures since charge carriers travel along the vertical direction (perpendicular to the superlattice) to reach the electrodes in the devices. In some embodiments, the superlattice structure is characterized by a carrier lifetime of at least about 30 ps at about 750 nm. This includes embodiments in which the superlattice structure is characterized by a carrier lifetime of at least about 40 ps, at least about 50 ps, at least about 60 ps, or at least about 70 ps at about 750 nm. This further includes embodiments in which the superlattice structure is characterized by a carrier lifetime on the order of hundreds of ps or even thousands of ps. An increase in carrier lifetime translates to improved carrier transport and improved efficiency of certain photovoltaic devices incorporating such superlattice structures.

As discussed above, in some embodiments, the superlattice structure comprises alternating ultrathin layers of a group II-VI semiconductor and at least one additional semiconductor in which the ultrathin layers are extremely thin (e.g., less than about 10 nm) and are polycrystalline. Nevertheless, as shown in the Examples below, such structures exhibit excellent absorption and carrier transport properties and photovoltaic devices incorporating such structures are highly efficient.

The Examples below describe several specific, exemplary embodiments of superlattice structures. However, other superlattice structures having various combinations of the offsets, band gaps, carrier types, thicknesses, periodicity, compositions and other properties described above are possible.

The ultrathin layers of group II-VI semiconductors and group II-VI semiconductor superlattice structures may be disposed over a substrate. A variety of substrates are possible, including glass coated with a transparent conducting oxide (TCO), graphene sheets or other metal or carbon nanostructures on transparent supports (glass, plastic, etc.).

The ultrathin layers of group II-VI semiconductors and group II-VI semiconductor superlattice structures may be doped or undoped.

Photovoltaic Devices

In another aspect, photovoltaic devices incorporating the ultrathin layers of group II-VI semiconductors and/or group II-VI semiconductor superlattice structures are provided. In some embodiments, the photovoltaic device comprises a substrate, a back contact layer disposed over the substrate, an n-type ultrathin layer of a group II-VI semiconductor between the substrate and back contact layer, and a p-type ultrathin layer of a group II-VI semiconductor between the substrate and back contact layer. Any of the ultrathin layers of group II-VI semiconductors disclosed above may be used. A specific, exemplary photovoltaic device 100 is shown in FIG. 1 and described in Example 1 below.

In some embodiments, the photovoltaic device comprises a substrate, a back contact layer disposed over the substrate, a group II-VI semiconductor superlattice structure between the substrate and back contact layer, and an ultrathin layer of a group II-VI semiconductor between the substrate and back contact layer, wherein the superlattice structure and the ultrathin layer comprise different majority charge carriers (i.e., either p-type or n-type). However, in some embodiments, the ultrathin layer of a group II-VI semiconductor may be replaced by a layer of a different type of semiconductor, provided the layer comprises a different majority charge carrier than the group II-VI semiconductor superlattice structure. Any of the superlattice structures and ultrathin layers disclosed above may be used. With respect to the layer of a different type of semiconductor, any of the additional semiconductors described above may be used (e.g., group IV semiconductors, group III-V semiconductors). The layer of the different type of semiconductor may characterized by the thicknesses and properties described above with respect to the ultrathin layers of group II-VI semiconductors. Similarly, the layer of the different type of semiconductor may be formed using the pulsed laser deposition techniques described below.

Figure 4:
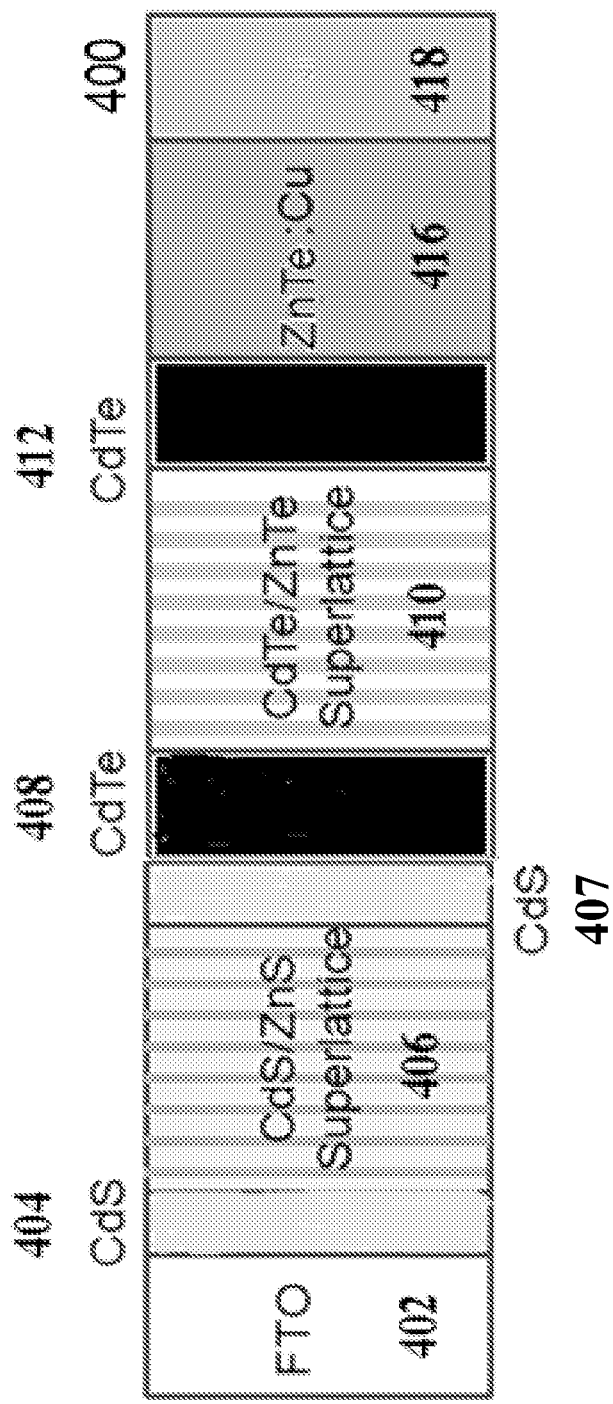
FIG. 4 shows a schematic of a superlattice photovoltaic (PV) device in which the CdS window and CdTe absorber are each partially replaced with a CdS/ZnS superlattice and a CdTe/ZnTe superlattice, respectively.

In some embodiments, the photovoltaic device comprises a substrate, a back contact layer disposed over the substrate, a first group II-VI semiconductor superlattice structure between the substrate and back contact layer, and a second group II-VI semiconductor superlattice structure between the substrate and back contact layer, wherein the first and second superlattice structures comprise different majority charge carriers (i.e., either p-type or n-type). Other material layers, including ultrathin layers of group II-VI semiconductors, may be disposed between the substrate and back contact layer and between the first and second superlattice structures. Any of the superlattice structures and ultrathin layers disclosed above may be used. A specific, exemplary photovoltaic device 400 is shown in FIG. 4 and described in Example 3 below.

Tandem-type photovoltaic devices comprising multiple group II-VI semiconductor superlattice structures, wherein the multiple group II-VI semiconductor superlattice structures comprise the same type of majority charge carrier (e.g., p-type) but are characterized by different band gaps may also be used. The different band gaps may include those for covering the solar spectrum. In some embodiments, the photovoltaic device comprises a substrate, a back contact layer disposed over the substrate, a p-n junction between the substrate and the back contact layer, and multiple group II-VI semiconductor superlattice structures between the p-n junction and the back contact layer, wherein the multiple group II-VI semiconductor superlattice structures comprise the same type of majority charge carrier but are characterized by different band gaps. The substrate may have a front transparent contact layer disposed over its surface. The multiple group II-VI semiconductor superlattice structures may be arranged such that the superlattice structure having the smallest band gap is closest to the back contact layer and the superlattice structure having the largest band gap is closest to the p-n junction, i.e., such that the band gaps increase from the back contact layer to the p-n junction. Other material layers, including ultrathin layers of group II-VI semiconductors, may be disposed between the substrate and back contact layer and between the superlattice structures. Any of the superlattice structures and ultrathin layers disclosed above may be used.

The photovoltaic devices may be characterized by a number of properties including open circuit voltage ($V_{oc}$), fill factor (FF), short circuit current ($J_{sc}$), power conversion efficiencies and photon-to-charge carrier conversion efficiencies (IPCE). In some embodiments, the photovoltaic device is characterized by a power conversion efficiency of at least about 7%. This includes embodiments in which the photovoltaic device is characterized by a power conversion efficiency of at least 10%, at least 15%, or at least 20%.

These power conversion efficiencies can refer to those measured over a particular spectral range, e.g., from about 400 nm to about 1000 nm.

Methods

In another aspect, methods for forming the ultrathin layers of group II-VI semiconductors, group II-VI semiconductor superlattice structures and photovoltaic devices are provided. The methods are based on the technique of pulsed laser deposition (PLD), in which a target material is exposed to a pulsed laser to create a plume of the atoms/molecules of the target material and the atoms/molecules of the target material are deposited onto a substrate. (However, in the methods, a pulsed electron beam or a pulsed ion beam may be used in place of the pulsed laser.) In one embodiment, a method comprises exposing a target material comprising a source of a group II-VI semiconductor to a pulsed laser, whereby an ultrathin layer of the group II-VI semiconductor is deposited on a substrate via pulsed laser deposition.

More than one ultrathin layer of a group II-VI semiconductor may be deposited over the substrate, e.g., to provide a multilayer structure, including a superlattice structure with sub-nm thickness precision control. Such multilayer and superlattice structures can be formed in situ, that is, without breaking vacuum in the PLD chamber or otherwise opening the PLD chamber to atmosphere. Thus, in one embodiment, a method comprises exposing a first target material comprising a source of a group II-VI semiconductor to a pulsed laser, whereby an ultrathin layer of the group II-VI semiconductor is deposited on a substrate via pulsed laser deposition and exposing a second target material comprising a source of an additional semiconductor (e.g., a second group II-VI semiconductor, a group IV semiconductor, a group III-V semiconductor) to a pulsed laser, whereby an ultrathin layer of the additional semiconductor is deposited over the substrate via pulsed laser deposition, in situ. To form a superlattice structure, these steps may be repeated to form alternating ultrathin layers of the group II-VI semiconductor and the additional semiconductor. The methods may be adjusted to form superlattice structures comprising alternating ultrathin layers of more than two different types of semiconductors simply by using the appropriate additional target materials in the PLD chamber. Such compositionally complex superlattice structures are typically not possible using certain epitaxial methods, even in MBE, due to limited number of source materials that can be used in a single deposition chamber.

Several deposition parameters may be varied, including the laser energy density (as controlled by the laser energy and focal spot area), the substrate temperature, the total chamber pressure, the partial pressure of oxygen in the chamber, the substrate-to-target distance, the angle of the laser with respect to the normal of the target, the laser repetition rate and the deposition time. The inventors have found certain combinations and certain ranges of deposition parameters which achieve ultrathin layers of group II-VI semiconductors and group II-VI semiconductor superlattice structures having certain properties (e.g., morphology, grain size, grain boundary, crystal structure and interface), including properties that are desirable for use in photovoltaic devices. The Examples below provide specific, exemplary sets of deposition parameters for achieving ultrathin layers of CdTe, CdS, ZnTe and ZnS as well as superlattice structures composed of such layers having certain properties. The ranges of at least the laser energy density and substrate temperature may vary from those set forth in the Examples below, particularly for other types of semiconductor layers and types of target materials. With respect to at least the laser angle, angles of 30° or 60° may also be used. With respect to the substrate-to-target distance, distances between 35 mm and 60 mm may also be used. With respect to the laser energy density, laser energy densities in the range of from about 0.3 J/cm$^2$ to about 10 J/cm$^2$ may be used.

The inventors have also found that the chamber pressure is a critical parameter for the deposition of at least certain ultrathin layers of group II-VI semiconductors and group II-VI semiconductor superlattice structures. As discussed above, the ultrathin layers making up the superlattice structures are desirably quite thin. However, the problem of back ablation (the decomposition of a layer as it is being deposited) typically limits the thinness of certain layers deposited using conventional pulsed laser deposition techniques. The problem of back ablation also typically limits the uniformity of thickness and the uniformity of chemical composition of very thin layers. The inventors have found that the problem of back ablation can be addressed by using elevated chamber pressures during deposition. Prior to this discovery, very low chamber pressures were typically used (e.g., less than $10^{-5}$ Torr, less than $10^{-6}$ Torr or even less than $10^{-8}$ Torr) during deposition in order to minimize the possibility of contamination of deposited layers. Similarly, prior to this discovery, background gases were not typically used during deposition, also to minimize the possibility of contamination. By "background gas" it is meant a gas or gas mixture that is intentionally introduced to the PLD chamber during deposition as opposed to a residual amount of gas that may be present due to the inability to achieve a perfect vacuum.

In some embodiments, the step of exposing the target material to a pulsed laser is carried out at a chamber pressure of greater than about $10^{-5}$ Torr. This includes embodiments in which the chamber pressure is greater than about $10^{-3}$ Torr or greater than about 0.1 Torr. This further includes embodiments in which the chamber pressure is in the range of from about 0.1 Torr to about 50 Torr, from about 0.1 Torr to about 25 Torr, or from about 0.5 Torr to about 20 Torr. A variety of background gases or gas mixtures may be used to achieve the elevated chamber pressures, depending upon the composition of the ultrathin layer to be deposited. Argon and oxygen are non-limiting examples of background gases. The partial pressure of oxygen in the chamber may be adjusted, depending upon the composition of the ultrathin layer to be deposited. By way of example only, a background gas mixture comprising $O_2$ at a partial pressure in the range of from about 1 mTorr to about 10 Torr may be used. In some embodiments, the step of exposing the target material to a pulsed laser is carried out using a background gas of $O_2$, Ar, or mixtures thereof at a pressure in the range of from about 1 mTorr to about 50 Torr and the chamber pressure is in the range of from about 1 mTorr to about 50 Torr. The inventors have also found that use of elevated chamber pressures and background gases allows the use of greater substrate temperatures, e.g., about 200° C. or greater, about 250° C. or greater, about 300° C. or greater, about 400° C. or greater, or about 500° C. At least some embodiments of the ultrathin layers of group II-VI semiconductors and group II-VI semiconductor superlattice structures show an improvement in overall quality when deposited using elevated chamber pressures achieved with background gases and elevated substrate temperatures. (See, e.g., the Examples below).

The inventors have also found that the problem of back ablation can be addressed (at least in part) by using lower laser energy densities. Prior to this discovery, laser energy densities in the range of about 1 to about 10 J/cm$^2$ were typically used during deposition. However, the inventors have found that, at least for certain ultrathin layers of group II-VI semiconductors and group II-VI semiconductor superlattice structures, lower laser energy densities are desirable. In some embodiments, the step of exposing the target material to a pulsed laser is carried out at a laser energy density of less than about 1 J/cm$^2$. This includes embodiments in which the laser energy density is less than about 0.5 J/cm$^2$ or about 0.3 J/cm$^2$. chamber pressure is a critical parameter for the deposition of at least certain ultrathin layers of group II-VI semiconductors and group II-VI semiconductor superlattice structures.

Due to the flexibility of the PLD technique, one ultrathin layer (e.g., CdTe) can be deposited under a certain set of deposition parameters which may be different from the set of deposition parameters used to deposit another ultrathin layer (e.g., CdS), but both ultrathin layers may be deposited, in situ, without breaking vacuum in the PLD chamber or otherwise opening the PLD chamber to atmosphere.

The PLD chambers used for the methods may make use of a scanning stage. Substrates may be coupled to the scanning stages, the methods disclosed above may be used to deposit one device incorporating the ultrathin layers of group II-VI semiconductors and/or group II-VI semiconductor structures in one location on the substrate. Subsequently, the substrate may be moved via the scanning stage and another, possibly different, device may be deposited on a different location on the substrate. Thus, the disclosed methods may be used to provide a plurality of devices on a single substrate, wherein each device may be the same or different.

In some embodiments, a method comprises exposing a first target material comprising a source of a first group II-VI semiconductor to a pulsed laser, whereby an ultrathin layer of the first group II-VI semiconductor is deposited on a substrate via pulsed laser deposition, and exposing a second target material comprising a source of an additional semiconductor (e.g., a second group II-VI semiconductor) to a pulsed laser, whereby an ultrathin layer of the additional semiconductor is deposited over the substrate via pulsed laser deposition, in situ, wherein either step (a), step (b), or both, is carried out using a background gas mixture and a chamber pressure of greater than about $10^{-5}$ Torr. In some embodiments, the chamber pressure is in the range of from about 0.1 Torr to about 50 Torr. In some embodiments, the background gas mixture comprises $O_2$ at a pressure in the range of from about 1 mTorr to about 10 Torr. In some embodiments, the substrate temperature is about 200° C. or greater. In some embodiments, the laser energy density is less than about 1 J/cm$^2$. In some embodiments, either step (a), step (b), or both is carried out using about 1.2 Torr $O_2$, a substrate temperature of about 500° C., a substrate-to-target distance of about 5.7 cm, and a laser energy density of about 0.4 J/cm$^2$. Such embodiments may be useful for forming CdTe-based superlattice structures, including CdTe/ZnTe superlattice structures. In some embodiments, either step (a), step (b), or both is carried out using about 5 to about 10 mTorr Ar, a substrate temperature of about 200° C., a substrate-to-target distance of about 5.7 cm, and a laser energy density of about 0.4 J/cm$^2$. Such embodiments may be useful for forming CdS-based superlattice structures, including CdS/ZnS superlattice structures. In these embodiments, the methods may comprise repeating steps (a) and (b), in situ, to provide a superlattice structure.

The ultrathin layers of group II-VI semiconductors, group II-VI semiconductor superlattice structures, devices incorporating the ultrathin layers and superlattice structures and related methods will be understood more readily by reference to the following examples, which are provided by way of illustration and are not intended to be limiting.

EXAMPLES

Example 1

High Efficiency CdS/CdTe Thin Film Solar Cells Made Using Pulsed Laser Deposition Pulsed Laser Deposition (PLD) was applied to prepare the CdS (100 nm)/CdTe (1.5 μm) thin film solar cells. A KrF excimer ($\lambda$=248 nm, pulse duration 20 ns) laser was employed for PLD. Before growth, the PLD chamber was evacuated to $5\times10^{-6}$ Torr. The KrF laser pulses of 60-200 mJ each at 10 Hz repetition frequency was direct at an angle of ~45° with respect to the normal of the targets of CdS and CdTe (ACI Alloys, 99.99% purity) and focused on, an area of about 2 mm$^2$ on the surface of the targets, respectively, to generate plumes of these materials. This corresponds to laser energy density of 3-10 J/cm$^2$ at the surface of the targets depending upon the laser spot size. The substrate-to-target distance was maintained at 35 mm. The substrates were 25 mm×25 mm FTO glass with resistance of about 20Ω. For CdS, the substrate temperature was varied in the range of 100-250° C. while the chamber pressure was maintained in vacuum ($<10^{-5}$ Torr) and for CdTe films, these parameters were varied in the range of 150-500° C. and vacuum-15 Torr. The common issue of pinholes in CdS and CdTe films made with other methods may be avoided by controlling the processing parameters.

Table 1 summarizes relevant properties of four single-layer samples of CdS and CdTe films. The two CdS films were fabricated at substrate temperatures of 150° C. and 200° C., respectively, in vacuum while the two CdTe films were fabricated at 200° C. in vacuum and 500° C. at 15 Torr Ar+$O_2$ gas, respectively. The thickness of the film was calibrated using a Tencor P16 Profiler and three measurements were taken for calculation of the average thickness. Optical transmission spectra were taken with a Cornerstone monochromator (Newport 74004) with Xe lamp illuminator (Newport 70611) with a calibrated UV-Si photodiode (Newport 71640) and the band gap $E_g$ was extracted through the fitting of the spectra. The PLD growth rate of films made by PLD depends on laser pulse energy, substrate temperature and deposition time. In the PLD of CdS and CdTe, the film growth rate increased with laser pulse energy from 60 to 200 mJ due to the increase in the flux of the ablated particles from the target. However, this trend was maintained only below certain threshold substrate temperatures depending on the chamber pressures (see more detailed discussion below). In particular, the deposition rate became negligible when the substrate temperature was significantly higher than the threshold temperature. On the other hand, it is worth pointing out that a comparable growth rate of CdTe can be obtained at a much lower laser pulse energy at higher substrate temperature and higher chamber pressure.

TABLE 1

Comparison of single layers of CdS and CdTe made with PLD

| Layer | Temperature of substrate (° C.) | Laser Condition (1 × 10$^{-5}$ Torr) | Eg (eV) | Average Thickness (nm) | Deposition Time (min) | Deposition Rate (nm/min) |
|---|---|---|---|---|---|---|
| CdS | 150 | 8 Hz, 140 mJ | 2.3 | 113 | 12 | 9.4 |
|  | 200 | 8 Hz, 140 mJ | 2.4 | 138 | 12 | 11.5 |
| CdTe | 200 | 8 Hz, 140 mJ | 1.4 | 262 | 12 | 21.8 |
|  | 500 | 10 Hz, 60 mJ | 1.5 | 450 | 20 | 22.5 |

Optical transmission spectra (not shown) of the CdS and CdTe films of Table 1 made on FTO substrates were obtained. The absorption edges of the two CdS films are comparable in the range of 480-580 nm, but the edge is notably sharper for the sample made at the higher substrate temperature of 200° C. The transmission spectra of the two CdTe films differ considerably while the absorption edges are both in the range of 760-840 nm. At the lower growth temperature in vacuum (red curve), an additional dip was observed around 860-870 nm. Since this feature does not appear on the spectrum of the CdTe film made at higher temperature of 500° C. in 15 Torr Ar+O$_2$ gas (black curve), it is possible that impurity phases may be present in the CdTe film made at the lower temperature. In addition, the absorption edge shows a red shift for the higher temperature sample.

Since CdS and CdTe are direct band gap semiconductors, equations 1 and 2 can be used to estimate the band gaps by replotting the transmission spectra obtained:

$$(\alpha h v)^2 \propto h v \quad \text{(Equation 1)}$$

$$\text{i.e., } [(-1/d) \times \ln(I/I_0) \times (1241/\lambda)]^2 \propto [(1241/\lambda) - E_g] \quad \text{(Equation 2)}$$

where $\alpha$ is the absorption coefficient, hv is the incident photon energy, d is the thickness of film, and the unit of the wavelength ($\lambda$) is nm. It is clear from the $(\alpha h v)^2$ vs. hv curves obtained (not shown) that the band gap of CdS is near 2.4 eV and the band gap of CdTe around 1.5 eV. These band gaps are consistent with stoichiometric CdS and CdTe, respectively. Generally, growth of stoichiometric films poses a challenge in compound semiconductors such as CdS and CdTe. The observation of the nearly ideal band gaps for CdS and CdTe films made using PLD suggests PLD is a promising approach that can replicate the chemical composition of the target to the film. In particular, the energy of the deposited ions/atoms in PLD is considerably higher than in many other methods such as CSS, leading to greater surface mobility and hence, better stoichiometry at lower substrate temperatures. It should be noted that the substrate temperature plays a critical role in the deposition rate and composition of the film. In the case of CdS, a monotonic improvement of the absorption edge was observed with increasing substrate temperature and the best substrate temperature is around 200° C. in vacuum. Above 200° C., considerably reduced growth rate was observed. A similar trend of reduced growth rate at above 200° C. was also observed in vacuum PLD CdTe films, suggesting a transition in the sticking coefficient occurs at around 200° C. Increasing PLD chamber pressure resulted in an increase of this transition temperature. At around 15 Torr of the Ar+O$_2$ gas pressure, the PLD of CdTe films could be carried out at temperatures up to 500° C. The absorption of the CdTe films made at 200° C. in vacuum and 500° C. at 15 Torr of the Ar+O$_2$ gas pressure was compared. Comparable absorption edges are observed in the two samples. X-ray diffraction (XRD) θ-2θ analysis (not shown) on these samples suggests these CdTe films are polycrystalline with a cubic structure. While the XRD patterns for the CdTe samples made at 200° C. in vacuum and 500° C. at 15 Torr of the Ar+O$_2$ gas pressure are comparable, the XRD peak intensity for the CdTe phase increases with the substrate temperature at a given chamber pressure below the transition temperature is reached.

The morphology of the single-layer samples was examined using scanning electron microscopy (SEM). A thin layer of Au was coated on the samples before SEM images were taken to avoid the charging effect. The SEM images (not shown) of the CdS films deposited at 150° C. and 200° C., respectively, reveal that the films are fairly uniform with some fine textures. The texture size is considerably larger at the higher growth temperature, providing evidence of promoted grain growth at elevated substrate temperature. No obvious pinholes can be observed on these CdS films, which suggest the CdS films made with PLD can be as thin as ~100 nm in the solar cells. The SEM images (not shown) of the CdTe films are also uniform, respectively, for the PLD processing conditions of 200° C. in vacuum and at 500° C. at 15 Torr of Ar+O$_2$ gas pressure. However, the surface of latter is much more compact and uniform than that of the former. This may be attributed to the lower laser energy density used in the higher temperature grown sample while maintaining a comparable growth rate of 22.5 nm/min. The higher substrate temperature will provide high mobility to the growing species carried to the substrate by the laser plume and therefore promote the lateral growth of the film.

FIG. 1 shows the schematic structure of fabricated CdS/CdTe thin film solar cells 100, including a substrate 102, a layer 104 of CdS, a layer 106 of CdTe, a back contact layer 108 and a layer 110 of silver paste. Not shown is a transparent front conductor layer between the substrate 102 and the layer 104 of CdS. Some solar cells additionally included a high-resistance transparent layer between the substrate 102 and the transparent front conductor layer. The CdS and CdTe layers were fabricated in situ using PLD. Two kinds of solar cells were fabricated based on this scheme. These devices are otherwise identical except the CdTe layers were made at different conditions with one at 200° C. in vacuum and the other at 500° C. at 15 Torr of Ar+O$_2$ gas pressure. CdTe layers substantially free of pinholes were obtained when using more than 1.2-15 Torr pressure. The oxygen in Ar+O$_2$ plays an important role in nucleation of CdTe. Furthermore, a low oxygen partial pressure was found to be favorable to increase the open-circuit voltage $V_{ox}$ by improving the quality of the CdS/CdTe interface and the uniformity of CdTe nucleation.

After CdS/CdTe bilayer deposition, CdCl$_2$ annealing was carried out in a tube furnace at 360° C. for 30 minutes with a continuous flow of 100 sccm Ar and 25 sccm O$_2$. After the annealing, the samples were etched with Br+CH$_3$OH before the HgTe:Cu-doped graphite was painted on the cell as the back contact. The paste was made by stirring 4 g HgTe:Cu (or 2 atomic % Cu) powder into 10 g graphite paste. The devices were annealed in a tube furnace at 280° C. with a 100 sccm Ar flow for 30 minutes to reduce the contact resistance. A thin layer of silver paste was then applied to the back contact. The device was then placed in an oven at 100° C. for 1 hour for curing the silver paste.

The electrical properties of the two kinds of solar cells were measured using a CHI660D electrochemical workstation and a Newport solar simulator at 1.5 AM (~100 mW/cm$^2$). Two representative devices, one from each kind, were compared (data not shown). The higher temperature processed cell shows a short-circuit current $J_{sc}$ of 29.95 mA/cm$^2$, an open-circuit voltage ($V_{oc}$) of 0.635 V, and a fill factor (FF) of 35.14%. The power conversion efficiency of this cell is therefore 6.68%, which was much higher than that (2.76%) of the lower temperature processed cell. The major difference in the two J-V curves of these two devices is their $V_{oc}$ values, which may be attributed to the difference in the CdTe film textures discussed above. In the higher temperature process, CdTe film growth was carried out in a low partial pressure of oxygen, which may provide several benefits including increasing the acceptor density, decreasing pinhole density and grain size via promoted CdTe nucleation. The effect of the increased acceptor density may not be significant considering the comparable $J_{sc}$ values for the two devices. The argument of improved microstructure is supported by the much finer morphology of the CdTe films made at the higher temperature in oxygen as discussed above. In addition, the solar cell performance was evaluated by recording the incident photon-to-charge carrier conversion efficiency (IPCE) at different incident wavelengths (data not shown). The IPCE was calculated by IPCE (%)=1240$J_{sc}/\lambda I_{inc}$ X100, where $I_{inc}$ is the power of the incident light. An IPCE maximum of about 67% at 620 nm is blue shifted from the peak absorption of CdTe (~800 nm) possibly due to the oxygen-doping in CdTe during PLD.

In summary, PLD has been applied for fabrication of CdS and CdTe thin films as well as the CdS/CdTe thin film solar cells. A processing window for PLD in terms of the substrate temperature, Ar+$O_2$ pressure, and laser energy density has been identified. The common pinholes in CdTe films can be eliminated under lower laser power around 60 mJ or 3 J/cm$^2$ and high chamber pressure of 1.2 Torr-15 Torr Ar+$O_2$. The application of low partial pressure oxygen during PLD of CdTe layer was found particularly beneficial to an optimal microstructure of the CdTe layer and high power conversion efficiency up to 6.68% has been demonstrated. This result demonstrates PLD may provide simple and robust technique for in situ deposition of single layer and multiple layers of II-VI semiconductors.

Example 2

Effects of the Substrate Temperature on the Properties of CdTe Thin Films Deposited by Pulsed Laser Deposition Experimental. The growth of CdTe films was carried out in a vacuum chamber maintained at ~10$^{-6}$ Torr employing a Kr:F excimer laser at 248 nm with a pulse energy and repetition rate of 60 mJ and 10 Hz, respectively. The CdTe target (purity 99.99 at.%) was bonded on a rotating target holder, in order to avoid the local overheating to the target. The sheet resistivity of the FTO substrates was ~20 Ω/sq. The distance between the target and the substrate holder inside the vacuum chamber was 3-4 cm and the incident laser beam made an angle of ~45° with the sample holder during deposition.

The deposition rate of the films was calibrated using a surface profilometer (model No. Ambios XP-2 or Tencor P16). The optical transmittance and the surface morphology of the films were characterized using an UV/Vis spectrophotometer (model Perkin Elmer-Lambda 950) and scanning electron microscopy (SEM, HITACHI S-4800), respectively. X-Ray Diffraction (XRD) patterns were obtained using a X-ray diffractometer (DanDongHaoYuan DX-2700) with Cu $K_\alpha$ of wavelength of 1.54 Å.

Deposition Rate. Table 2 shows the processing parameters, thickness and deposition rate for the CdTe films. The same laser repetition rate of 10 Hz, pulse energy of 60 mJ and total growth time of 20 min was used for all different runs listed in Table 2. The notable dependence of films thickness on the substrate temperatures is shown in Table 2. As the substrate temperature was increased from 100° C. to 150° C., then to 200° C., there is a corresponding increase in the film deposition rate by 81.2% and 136.0%, respectively, from 7.25 to 13.14, then to 17.11 nm/min. However, when the substrate temperature was raised to 250° C., the film deposition rate falls by 47.6%, from 17.11 to 8.97 nm/min, possibly due to the re-evaporation of the film at relatively high temperatures.

TABLE 2

Processing parameters, thickness and deposition rate of CdTe films

| Substrate temperature ($T_s$/° C.) | Energy per pulse (mJ) | Growth time (min) | Repetition rate (Hz) | Average thickness (nm) | Deposition rate (nm/min) |
|---|---|---|---|---|---|
| 100 | 60 | 12 | 10 | 87.00 | 7.25 |
| 150 | 60 | 12 | 10 | 157.67 | 13.14 |
| 200 | 60 | 12 | 10 | 205.33 | 17.11 |
| 250 | 60 | 12 | 10 | 107.67 | 8.97 |

Optical Properties. The white light transmittance of CdTe films grown at different temperatures of 100° C., 150° C., 200° C. and 250° C. was compared (data not shown). All curves show a sharp absorption edge at the wavelength in the 800 nm-900 nm range, corresponding to a well-defined semiconductor band gap anticipated for CdTe.

$(\alpha h\nu)^2$-h$\nu$ plots of CdTe films deposited at different substrate temperatures were obtained (data not shown). For CdTe with a direct band gap, the Tauc formula "$\alpha h\nu=A(h\nu-E_g)^n$" can be presented as Equation (3) below:

$$\alpha h\nu = A(h\nu - E_g)^{1/2} \quad \text{(Equation 3)}$$

where $\alpha$ is the absorption coefficient (which can be determined from the formula $\alpha=-(\ln T)/d$, where T is the transmittance rate and d is the thickness of the CdTe film); h$\nu$ is the photon energy; and $E_g$ is the value of the band gap. According to Equation 3, the $E_g$ of CdTe films can be estimated from the $(\alpha h\nu)^2$-h$\nu$ plots of CdTe films. It is clear from the $(\alpha h\nu)^2$-h$\nu$ plots that the band gaps of all as-deposited CdTe thin films are in the range of 1.45 eV to 1.50 eV. Specifically, when the substrate temperatures are 100° C., 150° C., 200° C. and 250° C., the band gaps ($E_g$) of the films are 1.454 eV, 1.467 eV, 1.479 eV and 1.474 eV, respectively. The values are in good agreement with theory (1.4-1.5 eV). A corresponding increase in the $E_g$ of films from 1.454 eV to 1.479 eV can be found with an increase in substrate temperature from 100° C. to 200° C. However, this trend is reversed at higher temperature of 250° C. and the $E_g$ of the film drops to 1.474 eV.

Crystal Structure. The X-ray diffraction of FTO and CdTe films deposited on FTO glass at different substrate temperatures were obtained (data not shown). Through analysis, it was found that the relatively higher and narrower peaks: (110), (101), (200), (211), (310) and (301) are related to tetragonal $SnO_2$ of FTO glass.

The cubic phase CdTe has a lattice constant a=6.48 Å, whereas the hexagonal phase CdTe has the lattice constants a=4.58 Å and c=7.47 Å. CdTe polycrystalline films composed of cubic phase and hexagonal phase have been used for thin film solar cell fabrications. The as-deposited films at all substrate temperatures exhibit polycrystalline structures. Notably, phase transitions from hexagonal to cubic for CdTe films are observed with an increase in substrate temperature, owing to the metastable nature of the hexagonal CdTe. As can be seen from the X-ray diffraction data, the dominant phase is hexagonal phase at the substrate temperatures of 100° C. and 150° C., with a (110) preferential orientation, while the presence of the peak at 2θ=46.433° corresponding to the cubic (311) orientation indicates the presence of cubic phase. However, when the substrate temperatures are 200° C. and 250° C., the cubic phase preferentially oriented (111) becomes the predominant phase and the presence of the peak at 2θ=22.319° associated with the hexagonal (100) shows the presence of hexagonal phase.

Specifically, the X-ray diffraction data shows that the phase transition is evidenced by the increase in the intensity of the peak at 2θ=23.758° corresponding to the cubic (311). It is clear that the intensity of the peak at 2θ=23.758° increases significantly when there is an increase in substrate temperature from 100° C. to 250° C.

Surface Morphology. When viewed with naked eyes, the as-deposited CdTe films have a mirrorlike surface with dark gray color regardless of the substrate temperature. Through the SEM images (not shown), however, great differences are observed.

As can be seen from the images, at the temperature of 100° C., the grain size is smaller and the crystal quality is relatively poor. With the increase in substrate temperature from 100° C. to 200° C., larger-sized grains and better-crystallized films are obtained, which is due to the relatively high mobility of the particles on the substrate surface at higher $T_s$. The CdTe films deposited at the temperature of 200° C. have a compact, dense and uniform structure, with the average grain size of about 30 nm. The interface of the grains can be seen clearly at 200° C. Such CdTe films are suitable for use in solar cells. By contrast, when the substrate temperature is increased to 250° C., the interface of the grains becomes less clear and the sintering of grains occurs.

In summary, CdTe polycrystalline films have been deposited at different substrate temperatures by PLD and the dependence of the properties of the films on the substrate temperature has been investigated. The band gaps ($E_g$) of the CdTe films deposited at the substrate temperature of 100° C., 150° C., 200° C. and 250° C., are 1.454 eV, 1.467 eV, 1.479 eV and 1.474 eV, respectively, which are in good agreement with theory. All the as-deposited films are polycrystalline, mixed with cubic phase and hexagonal phase, regardless of the substrate temperature. Moreover, as the substrate temperature is increased, the phase transition from hexagonal to cubic for the as-deposited CdTe films has been observed. The CdTe films deposited at the substrate temperature of 200° C. have a higher compactness and density compared to the films deposited at other substrate temperatures. The grain size at this temperature is relatively large with an average dimension of about 30 nm.

Example 3

Single Offset Superlattice Thin Film Solar Cells Prepared by KrF Pulsed Laser Deposition Unlike conventional superlattice or MQW structured PVs, in the superlattices of this Example, the original (primary) semiconductors (i.e., CdTe and CdS) were each paired with a semiconductor having a higher band gap. In particular, CdTe ($E_g$~1.4-1.5 eV) was paired with the photoactive semiconductor ZnTe ($E_g$~2.25 eV) to form a single offset superlattice (SOS) having zero valence band offset and CdS ($E_g$~2.4 eV) was paired with the window semiconductor ZnS ($E_g$~3.7 eV) to form a single offset superlattice (SOS) having zero conduction band offset. FIG. 2 shows the two types of SOS band structures. FIG. 2A shows SOS A having zero conduction band offset (such as a CdS/ZnS superlattice) and FIG. 2B shows SOS B having zero valance band offset (such as CdTe/ZnTe superlattice). The specific energy band information of these superlattices and a few related semiconductor superlattices are listed in Table 3. As shown in FIG. 2, there are at least three different interband transitions in each SOS corresponding to light absorption. Taking FIG. 2B as an example, the three transitions are: 1) from the common valence band to higher conduction band (top of the superlattice potential well), 2) from the common valence band to the lower conduction band (bottom of the superlattice potential well), and 3) from the bottom to above the superlattice potential well. The third excitation is particularly beneficial to CdTe-based PVs since it may provide a small band gap excitation to infrared photons in the solar spectrum. In addition, the excitonic energy levels formed in the multiple quantum well structures (between the bottoms of conduction bands for CdTe and ZnTe, allows additional excitation of electrons from valance band to these levels, resulting in exciton-assisted photon absorption. The superlattices of this Example are distinguished from conventional MQW or superlattice structures which pair the original (primary) semiconductors with a second semiconductor of lower band gap $E_g$, which causes impurity levels to be generated inside the band gap of the primary semiconductor, resulting in formation of deep traps of charges. However, the superlattices of this Example avoid this problem, e.g., by use of ZnTe with its larger $E_g$ to pair up with CdTe. Similarly, the use of ZnS with its larger $E_g$ to pair up with CdS will provide the window superlattice with better transparency. In addition, since the valance band is not affected in a SOS having zero offset in the valence band ($\Delta Ev=0$), hole transportation is not influenced, i.e., no additional mechanism for hole trapping is introduced in the SOS. This is very important for the deportation of carriers in p-type SOS such as CdTe/ZnTe superlattice that no new charge (holes in p-type) recombination/trapping mechanism is introduced via generation of the superlattice. A similar explanation may be applied to the SOS with zero offset conduction band ($\Delta Ec=0$), such as n-type CdS/ZnS superlattice that the electron transport is not interrupted via any new charge recombination mechanism due to the superlattice. In summary, single offset superlattice structures are beneficial by providing specific tuning of band structure and charge transport, which are both are critical to high performance PVs.

TABLE 3

Band structure of several II-VI group materials for SOS

| Materials | Conduction band difference | Valence band difference | Type |
|---|---|---|---|
| CdTe/ZnTe | 0.77 eV | 0.05 eV | SOS B |
| ZnSe/CdSe | 0.86 eV | 0.11 eV | SOS B |
| ZnSe/Si | 0.14 eV | 0.76 eV | SOS A |
| ZnS/CdS | 0 eV | 1.28 eV | SOS A |

Experimental. The pulsed laser deposition (PLD) system 300 with a KrF laser (λ=248 nm) for fabrication of CdTe-based superlattice PVs is shown schematically in FIG. 3. The system 300 includes a PLD chamber 302. Within the PLD chamber 302 are the target materials 304. As shown in the expanded view, four different target materials 304A-D are used, each comprising the appropriate source of a group II-VI semiconductor, respectively. The pulsed laser 306 creates a plume 308 of the atoms/molecules of each of the target materials 304 which are subsequently deposited over the substrate 310. A heater 312 is used to adjust the temperature of the substrate 310. A pump 314 is coupled to the PLD chamber 302. Background gases or gas mixtures may be introduced into the PLD chamber 302 via appropriate inlet sources and flow controllers (not shown).

Two types of PVs were prepared using this system. One was a thin film CdS/CdTe PV and the other was a SOS PV with a part of the CdS window replaced with CdS/ZnS SOS and a part of the CdTe absorber replaced with CdTe/ZnTe SOS. The SOS PV 400 is depicted schematically in FIG. 4.

The SOS PV 400 includes a FTO substrate 402, a layer 404 of CdS, a CdS/ZnS superlattice structure 406 (a window superlattice structure), a layer 407 of CdS, a layer 408 of CdTe, a CdTe/ZnTe superlattice structure 410 (an absorber superlattice structure), a layer 412 of CdTe, a back contact layer 416 and a layer 418 of metal paste (e.g., silver or nickel). The same total thicknesses for the window and absorber layer, respectively, were maintained between the two PVs for comparison.

Figure 3:
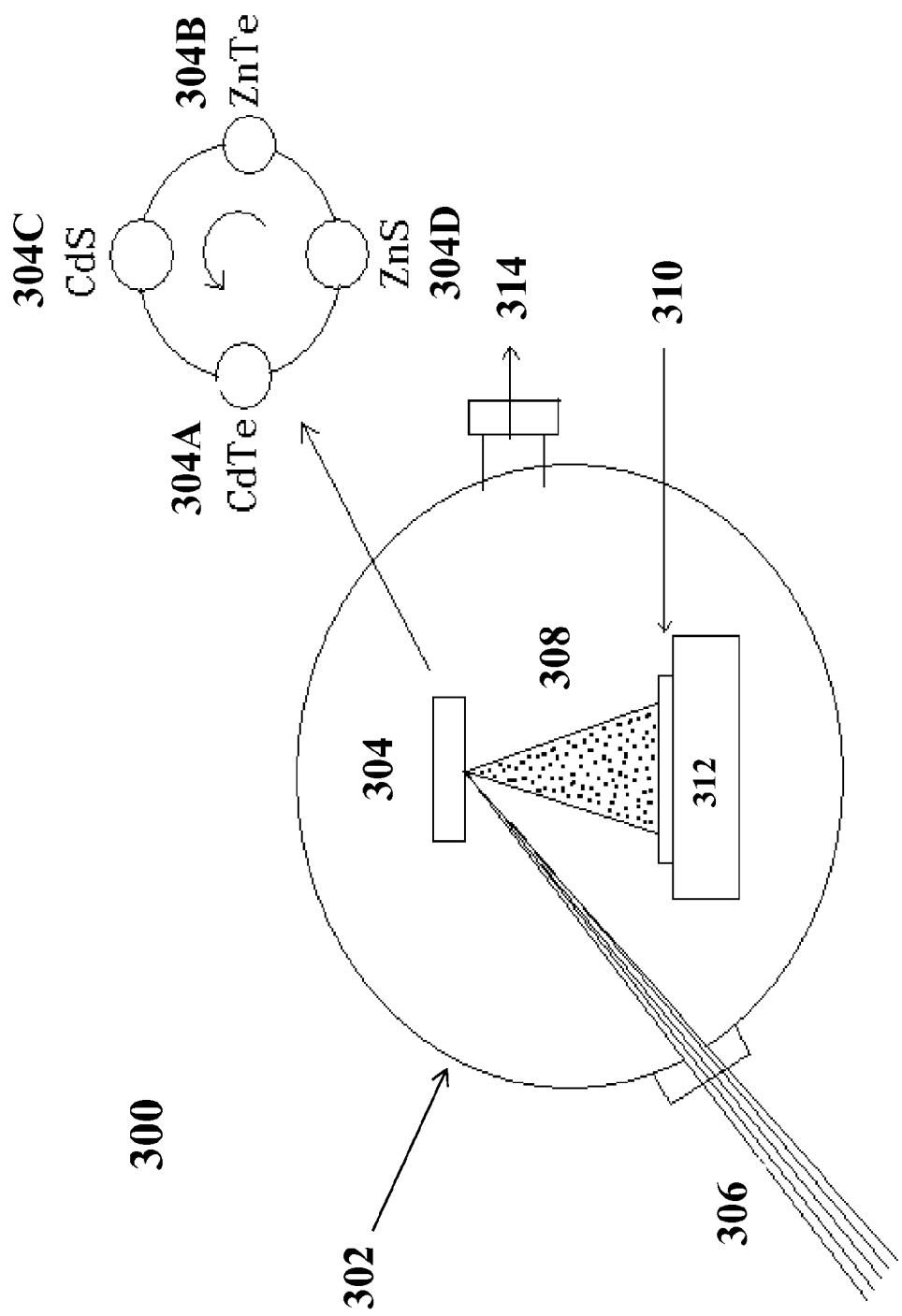
FIG. 3 shows a schematic of a pulsed laser deposition system for CdTe-based superlattice PVs. In source targets are controlled by computer and their motion is synchronized with the laser pulse for precise control of the layer thickness.

As shown schematically in FIG. 3, four targets of ZnS, CdS, CdTe, ZnTe were mounted in the chamber and the switch of the target was synchronized with laser pulse generation controlled by a computer, allowing in situ growth of the two types of PVs. The pulse energy was varied from 60 mJ to 200 mJ and the areal laser energy density on the surface of the target was controlled via laser beam focusing. This allowed control of the growth rate, which was in the range of 0.01-0.04 nm/pulse. With a repetition rate of 10 Hz, the component layer thickness could be controlled with sub-nm precision. For this Example, the total thickness of the window layer was in the range of 100 nm and that for the absorber layer, about 1.5 μm. The component thickness in superlattice (i.e., an individual layer) was typically less than 10 nm to maximize the quantum confinement effect. In this Example, the layers of CdS and ZnS in the CdS/ZnS SOS were chosen to be 3 nm/2 nm, yielding a total CdS/ZnS SOS thickness of about 50 nm at 10 cycles. The SOS was sandwiched by two CdS films of 20 nm (front) and 30 nm (back, towards CdTe layer), respectively. The component thicknesses of the layers of CdTe and ZnTe in the CdTe/ZnTe SOS were about 3 nm/2 nm and the number of cycles was 100. This yielded a total thickness of about 500 nm for the CdTe/ZnTe SOS, which was also sandwiched by 500 nm thick CdTe films as shown in FIG. 4.

Before growth, the PLD chamber was evacuated to $5 \times 10^{-6}$ Torr or better. The KrF laser pulses of 60-200 mJ each at 10 Hz repetition frequency were directed at an angle of ~45° with respect to the normal of the targets of CdS, ZnS, CdTe and ZnTe (ACI Alloys, 99.99% purity) and focused on an area of about 2 mm$^2$ on the surface of the targets, respectively, to generate plumes of these materials. This corresponds to laser energy density of 3-10 J/cm$^2$ at the surface of the targets. The substrate-to-target distance was maintained at 35 mm. The substrates were 25 mm×25 mm FTO glass with resistance of about 20Ω. For CdS, the substrate temperature was varied in the range of 100-250° C. while the chamber pressure was maintained in vacuum (<10$^{-5}$ Torr). The optimal processing temperature for CdS thin film in terms of morphology (e.g., pinhole free) was around 200° C. in vacuum. This value may be altered by altering the chamber pressure. Considering this, the CdS/ZnS SOS layer was made at 200° C. in vacuum. For CdTe films, these parameters were varied in the range of 150-500° C. and vacuum-15 Torr of Ar+O$_2$ gas with O$_2$ partial pressure of 8%. The issue of pinholes could be avoided with control of the processing parameters and for the single layer of CdTe, the optimal condition was found to be around 500° C. at 15 Torr of Ar+O$_2$ gas. Again, different optimal temperatures may occur at different chamber pressures due to the correlation of the temperature and pressure via CdTe and ZnTe phase diagrams. Lower substrate temperatures yields CdTe films of poor crystallinity, small grain size and pinholes, which are not suitable for highly efficient solar cells. However, raising substrate temperature alone may lead to CdTe re-evaporation, so this issue was resolved with raising the PLD pressure to 15 Torr to stabilize the CdTe phase, thereby improving its crystallinity and grain growth. However, the performance of the CdTe/ZnTe SOS was poor when it was made at the same condition due to primarily interlayer diffusion of Zn and Cd. Further optimization was carried out at reduced substrate temperatures and an optimal window was found around 200° C. in vacuum.

After CdS/CdTe bilayer deposition (or deposition of the SOS layers), a standard CdCl$_2$ annealing was carried out in a tube furnace at 360° C. for 30 minutes with a continuous flow of 100 sccm Ar and 25 sccm O$_2$. This annealing was expected to improve the grain-connection. The samples were then etched with Br+CH$_3$OH before the HgTe:Cu-doped graphite was painted on the cell as the back contact. The paste was made by stirring 4 g HgTe:Cu (or 2 atomic % Cu) powder into 10 g graphite paste. The devices were annealed in a tube furnace at 280° C. with a 100-sccm Ar flow for 30 minutes to reduce the contact resistance. A thin layer of silver paste was then applied to the back contact for connection of wires to electronics. The device was then placed in an oven at 100° C. for 1 hour for curing the silver paste.

Morphology. SEM images (not shown) of the surface morphology of the thin films and superlattices were obtained. The SEM images also clearly reveal the layer structure of the superlattice structures. Transmission electron microscopy (TEM) images were also obtained. The TEM images (not shown) clearly reveal the layer structure of the PVs and also show that the superlattice structures are polycrystalline.

Figure 5:
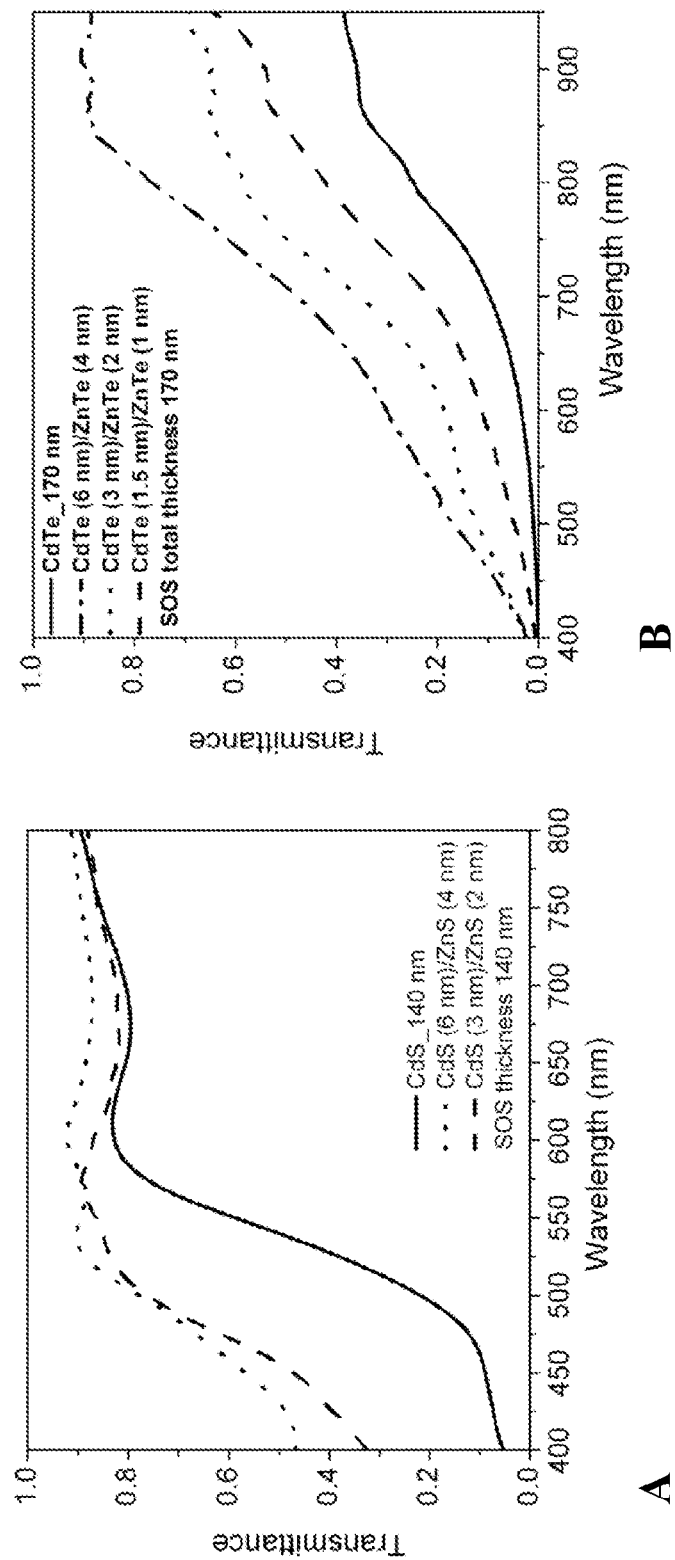
FIG. 5 shows transmission spectra of (A) a CdS film of 140 nm thickness in comparison with a CdS (6 nm)/ZnS (4 nm) and a CdS (3 nm)/ZnS (2 nm) SOS film of the same total thickness of 140 nm. All three samples were made at 200° C. in vacuum; and (B) a CdTe film of total thickness of 170 nm, in comparison with three SOS samples: CdTe (6 nm)/ZnTe(4 nm) SOS (17 cycles), CdTe (3 nm)/ZnTe(2 nm) SOS (34 cycles), and CdTe (1.5 nm)/ZnTe(1 nm) SOS (68 cycles) at 150° C. in vacuum. All samples were made with PLD on FTO substrates.

Transmittance Spectroscopy. FIG. 5A shows the transmittance spectra of a CdS film and CdS/ZnS SOS (14 cycles, d=6 nm+4 nm and 28 cycles, d=3 nm+2 nm) deposited at the same temperature of 200° C. in vacuum. The three samples have the same total thickness of about 140 nm. The CdS sample shows a typical transmittance edge at around 517 nm defined by the band gap of the CdS. For the CdS/ZnS SOS samples, the transmittance edge is extended to shorter wavelength around 400 nm, which is due to the larger $E_g$ of 3.68 eV for ZnS. In fact, a very shallow edge due to CdS can be still visible at longer wavelength above 500 nm. The difference in transmittance of the two SOS samples is considerably small, suggesting the component layer thickness in range of the few nm does not affect the light absorption properties of the window layer. Overall, the result in FIG. 5A shows much improved transmittance can be obtained in CdS/ZnS SOS window in the wavelength range of 400 nm to 800 nm. At 550 nm wavelength, the enhancement of the transmittance is almost 100%, which is significant to the performance of the solar cells. This enhancement is much higher in the shorter wavelength range and remains 5-10% even in the longer wavelengths of 600 nm-800 nm.

FIG. 5B compares the transmittance of a CdTe film and three SOS samples: CdTe (6 nm)/ZnTe(4 nm) SOS (17 cycles), CdTe (3 nm)/ZnTe(2 nm) SOS (34 cycles), and CdTe (1.5 nm)/ZnTe(1 nm) SOS (68 cycles) made at the same temperature of 150° C. in vacuum. The four samples have same total thickness of about 170 nm. Due to the presence of ZnTe, the transmittance of CdTe/ZnTe SOS is higher overall than that of single layer CdTe film. The difference between the transmittance curves of the SOS samples and single-layer CdTe sample reduces with reduced thickness of the component layers in the SOS due to the enhanced quantum confinement effect. Considering this, the SOS PVs were made with the thinner component layers.

Efficiency. The electrical properties of the two kinds of solar cells were characterized using a CHI660D electrochemical workstation and a Newport solar simulator at 1.5 AM (~100 mW/cm$^2$). Two representative devices, one from each kind, were compared in FIG. 6A. The reference CdS/CdTe cell (black curve) shows a short-circuit current density $J_{sc}$ of 29.95 mA/cm$^2$, an open-circuit voltage ($V_{oc}$) of 0.635 V, and a fill factor (FF) of 35.14%. The power conversion efficiency of this cell is therefore 6.68%. The SOS cell (dotted curve) has a considerably enhanced $J_{sc}$ of 33.3 mA/cm$^2$ and FF of 46.7%. A major difference in the J-V curves of these two devices is their $V_{oc}$ values. The $V_{oc}$ of the reference cell is 0.635 V and the $V_{oc}$ of the SOS cell is 0.571 V. This leads to an improved efficiency of 8.88%, about 33% improvement over the reference cell. This improvement may be at least partially attributed to the improved quantum efficiency in the SOS via an enhanced window transmittance and absorption. To quantify this, the incident photon-to-charge carrier conversion efficiency (IPCE) was measured at different incident light wavelengths and the results for these two types of cells are compared in FIG. 6B. The IPCE was calculated by IPCE (%)=1240$J_{sc}$/$\lambda I_{inc}$ X100, where $I_{inc}$ is the power of the incident light. For the reference cell (black curve), an IPCE maximum of about 67% at 620 nm is blue shifted from the peak absorption of CdTe (~800 nm) possibly due to the oxygen-doping in CdTe during PLD. With incorporation of the SOS structures, the IPCE increases dramatically at wavelengths above 450 nm while the peak position is more or less comparable to that of the reference cell. At the peak position, the IPCE is almost 100%, which may be at least partially due to the enhanced exciton generation in the superlattice.

Figure 7:
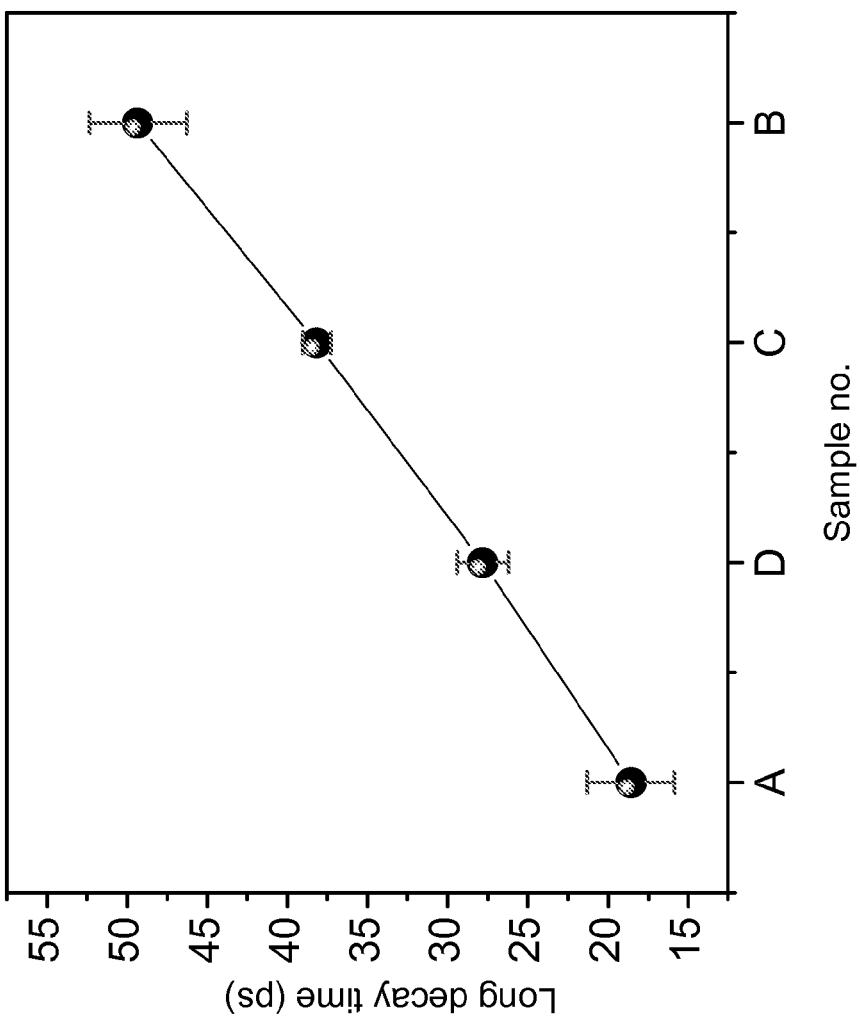
FIG. 7 shows the results of time resolved studies on charge carrier diffusion and lifetime in thin film and SOS structures using ultrafast laser spectroscopy. Sample A corresponds to the single ultra-thin CdTe film; sample B corresponds to the CdTe (1.5 nm)/ZnTe (1 nm) SOS; sample C corresponds to the CdTe (3 nm)/ZnTe (2 nm) SOS; and sample D corresponds to the CdTe (6 nm)/ZnTe (4 nm) SOS.

To further understand the mechanisms of the improved efficiency, time resolved studies on the charge carrier lifetime in these structures were performed. In these measurements, the unbias devices are excited by a 100-fs pump pulse of 750 nm. Differential reflection of an 810-nm and 100-fs probe pulse is measured as a function of the time delay between the probe and the pump pulses. The results are shown in FIG. 7. Sample A corresponds to the single ultra-thin CdTe film; sample B corresponds to the CdTe (1.5 nm)/ZnTe (1 nm) SOS; sample C corresponds to the CdTe (3 nm)/ZnTe (2 nm) SOS; and sample D corresponds to the CdTe (6 nm)/ZnTe (4 nm) SOS. Each of the SOS shows increased carrier lifetime (increased carrier transport) as compared to the single ultrathin CdTe film. In addition, carrier lifetime and transport increases as the thicknesses of the individual layers of the SOS decreases. Hence, the steady state carrier density under sunlight is expected to be higher in the superlattice structure, which may be one of the sources for efficiency improvement.

In summary, several single offset superlattice (SOS) structures were prepared. SOS is a semiconductor structure in which the conduction or valence band offset is or is approximately zero, so there are at least three types of carrier jumps, corresponding to lights of different wavelength. As the top of valence band is not broken (SOS B) or the bottom of conduction band is not broken (SOS A), the holes transportation is not influenced. This is very important for the deportation of carriers. The SOS structures improve the efficiency of solar cells when using the structures as a window layer and/or as an absorber layer. The improved efficiency may be attributed at least in part to two advantages provided by the SOS structures: improved exciton generation as manifested in the much improved quantum efficiency and improved charge transport supported by the improved lifetime of the charge carriers.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photovoltaic device comprising:
   a substrate,
   a back contact layer disposed over the substrate,
   a first group II-VI superlattice structure between the substrate and the back contact layer, the first group II-VI superlattice structure comprising alternating ultrathin layers of a first group II-VI semiconductor and at least one additional semiconductor selected from the group consisting of a second group II-VI semiconductor, a group IV semiconductor, and a group III-V semiconductor, and
   a layer of semiconductor between the substrate and the back contact layer, the layer of semiconductor comprising a different majority charge carrier than the first group II-VI superlattice structure,
   wherein the first group II-VI superlattice structure is a single offset superlattice characterized by one of a substantially zero conduction band offset of 0.15 eV or less and a substantially zero valence band offset of 0.15 eV or less,
   and further wherein the layer of semiconductor is a second group II-VI superlattice structure, wherein the first group II-VI superlattice structure is characterized by the substantially zero conduction band offset and the second group II-VI superlattice structure is another single offset superlattice characterized by a substantially zero valence band offset of 0.15 eV or less.

2. The photovoltaic device of claim 1, wherein the at least one additional semiconductor is a second group II-VI semiconductor.

3. The photovoltaic device of claim 1, wherein the first group II-VI semiconductor is CdTe.

4. The photovoltaic device of claim 1, wherein the first group II-VI semiconductor is CdS.

5. The photovoltaic device of claim 1, wherein the second group II-VI superlattice structure is composed of alternating ultrathin layers of CdTe and ZnTe and is characterized by the substantially zero valence band offset.

6. The photovoltaic device of claim 1, wherein the first group II-VI superlattice structure is composed of alternating ultrathin layers of CdS and ZnS and is characterized by the substantially zero conduction band offset.

7. The photovoltaic device of claim 1, wherein the second group II-VI superlattice structure is composed of alternating ultrathin layers of ZnSe and CdSe and is characterized by the substantially zero valence band offset.

8. The photovoltaic device of claim 1, wherein the first group II-VI superlattice structure is composed of alternating ultrathin layers of ZnSe and Si and is characterized by the substantially zero conduction band offset.

9. The photovoltaic device of claim 1, wherein the first group II-VI superlattice structure is characterized such that the primary semiconductor of the first group II-VI superlattice structure has a band gap that is less than the band gap of the second semiconductor of the first group II-VI superlattice structure.

10. The photovoltaic device of claim 1, wherein one of the first group II-VI semiconductor and the at least one additional semiconductor has a band gap of about 1.4 eV or greater and the other has a band gap that is greater.

11. The photovoltaic device of claim 1, wherein the first group II-VI superlattice structure is polycrystalline.

12. The photovoltaic device of claim 1, wherein the average thickness of the first group II-VI semiconductor and the average thickness of the at least one additional semiconductor is about 5 nm or less.

13. The photovoltaic device of claim 1, wherein each of the alternating ultrathin layers of the first group II-VI superlattice structure is about 5 nm or less.

14. The photovoltaic device of claim 1, wherein the second group II-VI superlattice structure comprises alternating ultrathin layers of a third group II-VI semiconductor and a fourth group II-VI semiconductor.

15. The photovoltaic device of claim 1, wherein the first group II-VI superlattice structure is composed of alternating ultrathin layers of CdS and ZnS and the second group II-VI superlattice structure comprises alternating ultrathin layers of CdTe and ZnTe.

16. The photovoltaic device of claim 1, wherein the valence band offset of the first group II-VI superlattice structure is 0.76 eV or greater.

17. The photovoltaic device of claim 1, wherein the first group II-VI superlattice structure is composed of the first group II-VI semiconductor and the additional semiconductor and wherein the first group II-VI semiconductor and the additional semiconductor are characterized by lattice constants which differ by at least 5%.

18. A photovoltaic device comprising:
a substrate,
a back contact layer disposed over the substrate,
a first group II-VI superlattice structure between the substrate and the back contact layer, the first group II-VI superlattice structure is composed of alternating ultrathin layers of CdS and ZnS, and
a second group II-VI superlattice structure between the substrate and the back contact layer, the second group II-VI superlattice structure comprising a different majority charge carrier than the first group II-VI superlattice structure,
wherein the first group II-VI superlattice structure is a single offset superlattice characterized by a substantially zero conduction band offset of 0.2 eV or less and the second group II-VI superlattice structure is another single offset superlattice characterized by a substantially zero valence band offset of 0.2 eV or less.

19. The photovoltaic device of claim 18, wherein the substantially zero conduction band offset is 0.15 eV or less and wherein the substantially zero valence band offset is 0.15 eV or less.

\* \* \* \* \*